(12) United States Patent
Taylor et al.

(10) Patent No.: US 6,841,795 B2
(45) Date of Patent: Jan. 11, 2005

(54) SEMICONDUCTOR DEVICES EMPLOYING AT LEAST ONE MODULATION DOPED QUANTUM WELL STRUCTURE AND ONE OR MORE ETCH STOP LAYERS FOR ACCURATE CONTACT FORMATION

(75) Inventors: Geoff W. Taylor, Storrs-Mansfield, CT (US); Scott W. Duncan, Andover, MA (US)

(73) Assignees: The University of Connecticut, Farmington, CT (US); Opel, Inc., West Warwick, RI (US)

( * ) Notice: Subject to any disclaimer, the term of this patent is extended or adjusted under 35 U.S.C. 154(b) by 0 days.

(21) Appl. No.: 10/340,942

(22) Filed: Jan. 13, 2003

(65) Prior Publication Data

US 2004/0079954 A1 Apr. 29, 2004

Related U.S. Application Data

(63) Continuation-in-part of application No. 10/280,892, filed on Oct. 25, 2002.

(51) Int. Cl.$^7$ .............................................. H01L 29/15
(52) U.S. Cl. .......................................... 257/14; 257/24
(58) Field of Search .............................. 257/14, 24–25, 257/89

(56) References Cited

U.S. PATENT DOCUMENTS

| | | | |
|---|---|---|---|
| 3,919,656 A | 11/1975 | Sokal et al. | 330/51 |
| 4,424,525 A | 1/1984 | Mimura | 357/23 |
| 4,658,403 A | 4/1987 | Takiguchi et al. | 372/96 |

(List continued on next page.)

OTHER PUBLICATIONS

*10–Gb/s High–Speed Monolithically Integrated photoreceiver Using InGaAs p–i–n PD and Planar Doped InAlAs/InGaAs HEMT's* by Akahori et al. IEEE Photonics Technology Letters, vol. 4, No. 7, Jul. 1992.

*10–Gbit/s InP–Based High–Performance Monolithic Photoreceivers Consisting of p–i–n Photodiodes and HEMT's* by Takahata et al., IEICE Trans. Electron., vol. E83–C, No. 6 Jun. 2000.

*10 Ghz Bandwidth Monolithic p–i–n Modulation–doped Field Effect Transistor Photoreceiver* by Dutta et al., Appl. Phys. Lett., vol. 63, No. 15, Oct. 11, 1993.

(List continued on next page.)

*Primary Examiner*—Allan R. Wilson
(74) *Attorney, Agent, or Firm*—Gordon & Jacobson, PC

(57) ABSTRACT

A semiconductor device includes a series of layers formed on a substrate, the layers including a first plurality of layers including an n-type ohmic contact layer, a p-type modulation doped quantum well structure, an n-type modulation doped quantum well structure, and a fourth plurality of layers including a p-type ohmic contact layer. Etch stop layers are used to form contacts to the n-type ohmic contact layer and contacts to the n-type modulation doped quantum well structure. Thin capping layers are also provided to protect certain layers from oxidation. Preferably, each such etch stop layer is made sufficiently thin to permit current tunneling therethrough during operation of optoelectronic/electronic devices realized from this structure (including heterojunction thyristor devices, n-channel HFET devices, p-channel HFET devices, p-type quantum-well-base bipolar transistor devices, and n-type quantum-well-base bipolar transistor devices).

In another aspect of the present invention, a high performance bipolar transistor device is realized from this structure by implanting p-type ions in a interdigitization pattern that forms a plurality of p-type ion implant regions on both sides of the p-type modulation doped quantum well structure to a depth that penetrates the n-type ohmic contact layer. The interdigitization pattern of the p-type implants reduces capacitance between the p-type modulation doped quantum well structure and the n-type ohmic contact layer to enable higher frequency operation.

35 Claims, 27 Drawing Sheets

U.S. PATENT DOCUMENTS

| | | | |
|---|---|---|---|
| 4,683,484 A | | 7/1987 | Derkits, Jr. .................. 357/16 |
| 4,806,997 A | | 2/1989 | Simmons et al. ............. 357/16 |
| 4,814,774 A | | 3/1989 | Herczfeld .................... 342/372 |
| 4,827,320 A | | 5/1989 | Morkoc et al. ............... 357/22 |
| 4,829,272 A | | 5/1989 | Kameya ...................... 333/139 |
| 4,899,200 A | | 2/1990 | Shur et al. .................... 357/30 |
| 4,949,350 A | | 8/1990 | Jewell et al. ................. 372/45 |
| 5,010,374 A | | 4/1991 | Cooke et al. ................. 357/16 |
| 5,105,248 A | | 4/1992 | Burke et al. .................. 357/24 |
| 5,202,896 A | | 4/1993 | Taylor ......................... 372/50 |
| 5,288,659 A | * | 2/1994 | Koch et al. ................... 438/31 |
| 5,337,328 A | | 8/1994 | Lang et al. ................... 372/45 |
| 5,386,128 A | | 1/1995 | Fossum et al. .......... 257/183.1 |
| 5,422,501 A | | 6/1995 | Bayraktaroglu ............. 257/195 |
| 5,436,759 A | | 7/1995 | Dijaili et al. ............... 359/333 |
| 5,452,118 A | * | 9/1995 | Maruska ...................... 398/204 |
| 5,698,900 A | | 12/1997 | Bozada et al. .............. 257/744 |
| 5,999,553 A | * | 12/1999 | Sun ............................. 372/50 |
| 6,031,243 A | | 2/2000 | Taylor ......................... 257/13 |
| 6,043,519 A | | 3/2000 | Shealy et al. ............... 257/195 |
| 6,479,844 B2 | * | 11/2002 | Taylor ......................... 257/192 |
| 6,720,584 B2 | * | 4/2004 | Hata et al. .................... 257/98 |
| 2002/0067877 A1 | | 6/2002 | Braun et al. | |

OTHER PUBLICATIONS

*20 Gbit/s Long Wavelength Monolithic Integrated Photoreceiver Grown on GaAs* by Hurm, et al., Electronics Letters, vol. 33, No. 7, Mar. 27, 1997.

*Monolithic Integrated Optoelectronic Circuits* by Berroth et al., Fraunhofer Institute for Applied Solid State Physics (IAF), Germany, IEEE 1995.

*Heterojunction Field–Effect Transistor* (HFET), Reprinted from Electronics Letters, vol. 22, No. 15, pp. 784–786, Jul. 17, 1986.

*High Temperature Annealing of Modulation Doped GaAs/ AlGaAs Heterostructures for FET Applications* by Lee et al., 1983 IEEE/Cornell Conf. On High–Speed Semiconductor Devices & Ckts, 8/83.

*Submicrometre Gate Length Scaling of Inversion Channel Heterojunction Field Effect Transistor* by Kiely et al., Electronics Letters, vol. 30, No. 6 Mar. 17, 1994.

*Theoretical and Experimental Results for the Inversion Channel Heterostructure Field Effect Transistor* by Taylor et al., IEE Proceedings–G, vol. 140, No. 6, Dec. 1993.

* cited by examiner

| LAYER MATERIAL | LAYER DOPING TYPE | TYPICAL DOPING CONCENTRATION (atoms/cm$^{+3}$) | TYPICAL LAYER THICKNESS(Å) | LAYER # | |
|---|---|---|---|---|---|
| InGaAs | P+ | 1E20 | 25 | 165b | ⎫ 30 |
| GaAs | P+ | 1E20 | 75 | 165a | ⎭ |
| GaAs (28b) | P | 1–5E17 | 300 | 164 | ⎫ 28 |
| AlAs (28a) | P+ | 3.5E18 | >20,<300 | 168b | ⎭ |
| GaAs (26b) | und | und | >6,<20 | 168a | ⎫ 26 |
| Al.15Ga.85As (26a) | und | und | 200–300 | 163c | ⎭ |
| Al.15Ga.85As | N+ | 3.5E18 | 80 | 163b | ⎫ |
| Al.15Ga.85As | und | und | 20–30 | 163a | |
| GaAs | und | und | 15 | 162 | |
| In.15Ga.85AsN ⎫×3 | und | und | 60 | 161 | 24 |
| GaAs ⎭ | und | und | 100 | 160b | |
| GaAs | und | und | 100–250 | 160a | ⎭ |
| Al.15Ga.85As | und | und | 5000 | 159 | ⎫ 22 |
| GaAs | und | und | 250–500 | 167 | ⎭ |
| GaAs ⎫×3 | und | und | 100 | 158 | ⎫ |
| In.15Ga.85AsN ⎭ | und | und | 60 | 157 | |
| GaAs | und | und | 15 | 156 | 20 |
| Al.15Ga.85As | und | und | 30 | 155d | |
| Al.15Ga.85As | P+ | 3.5E18 | 80 | 155c | ⎭ |
| Al.15Ga.85As (18b) | und | und | 200–300 | 155b | ⎫ 18 |
| GaAs (18a) | und | und | >6,<20 | 166b | ⎭ |
| AlAs | N+ | 3.5E18 | >30,<200 | 166a | —16 |
| GaAs | N+ | 3.5E18 | 1000–2000 | 153 | —14 |
| AlAs | und | und | 1701 | 151 | ⎫ |
| GaAs ⎫×7 | und | und | 696 | 152 | 12 |
| AlAs ⎭ | und | und | 1701 | 151 | ⎭ |
| GaAs SUBSTRATE | | SI | | 149 | ⎭ 10 |

FIG.1B

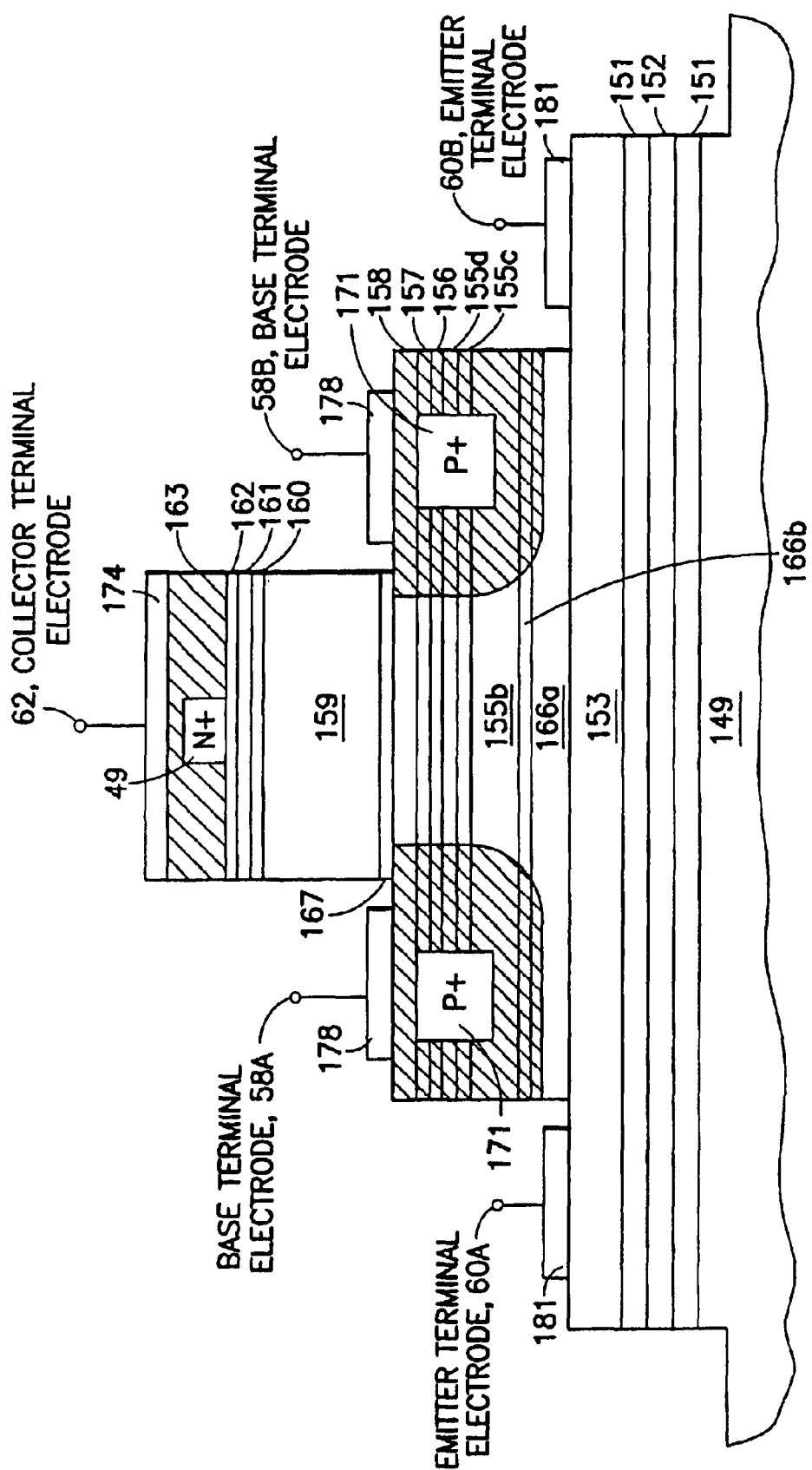

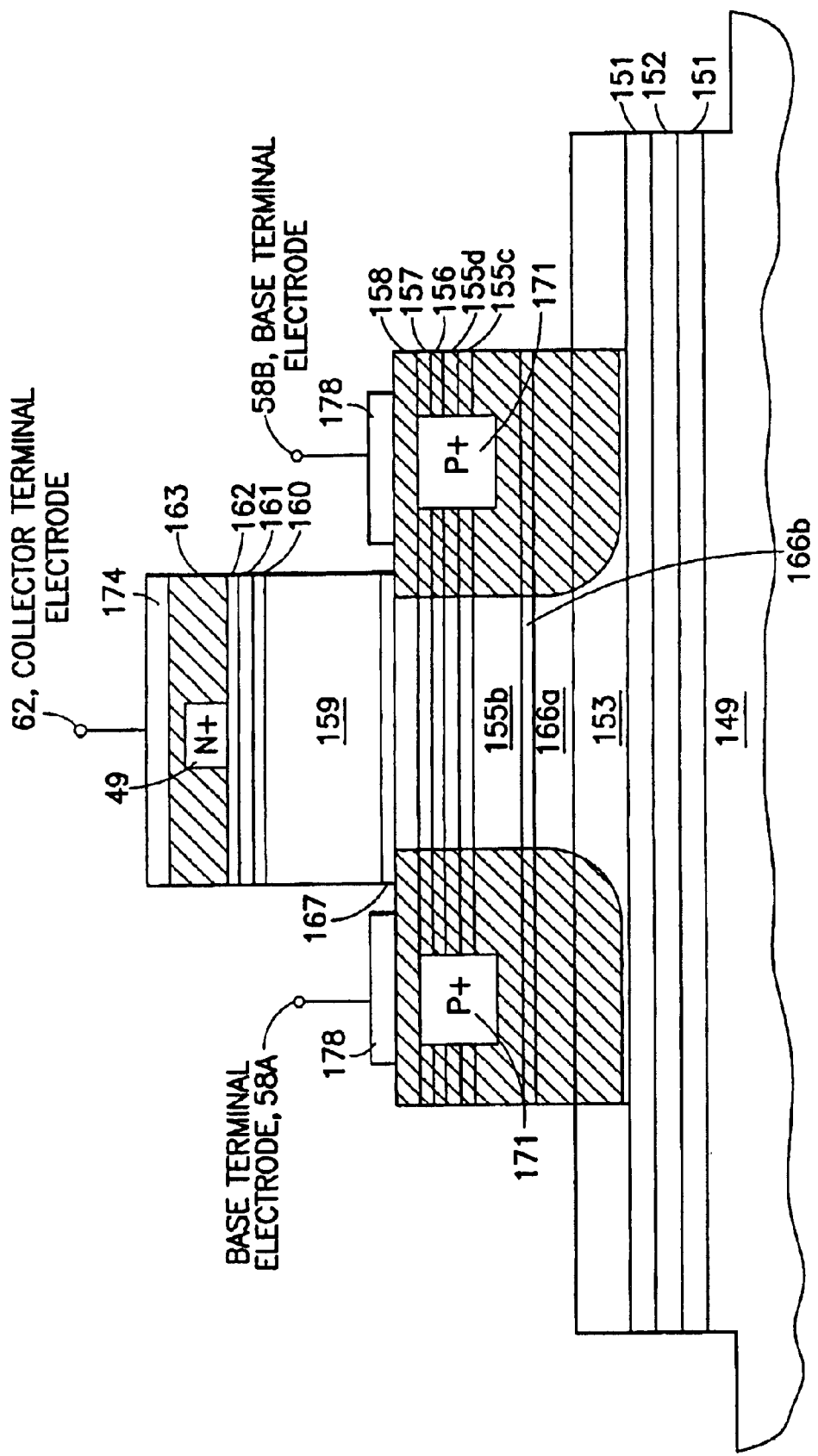
FIG.8B1

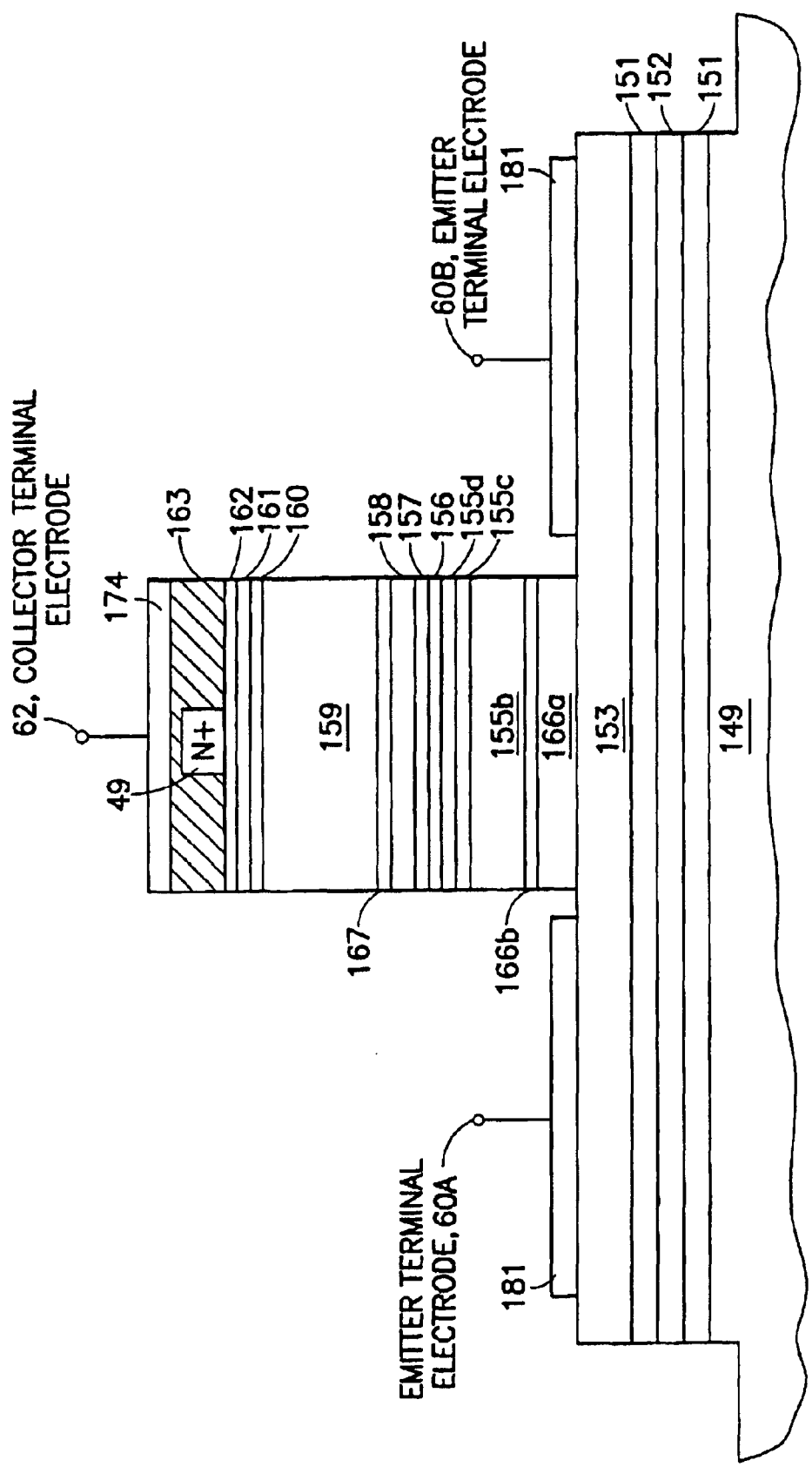
FIG.8B2

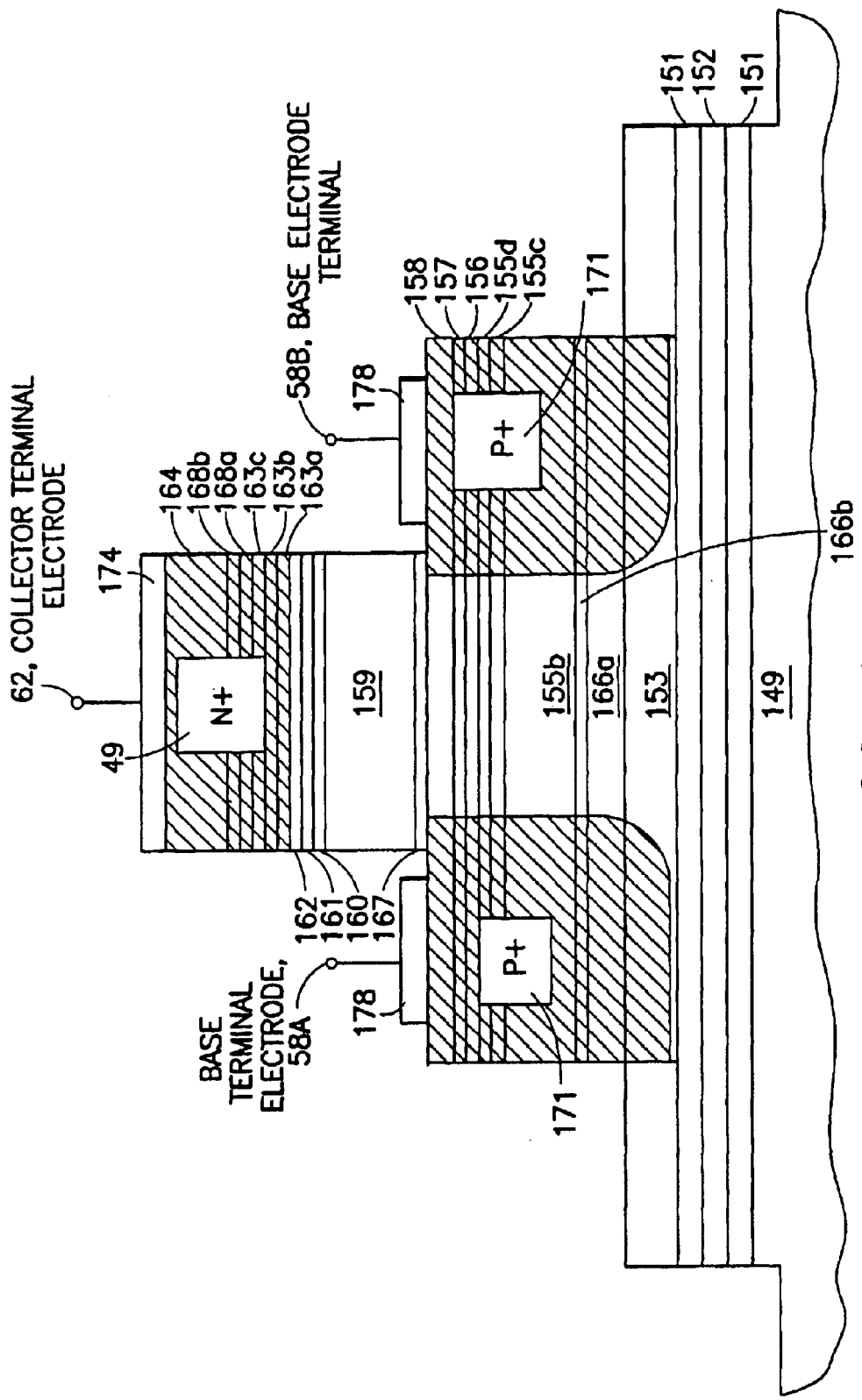

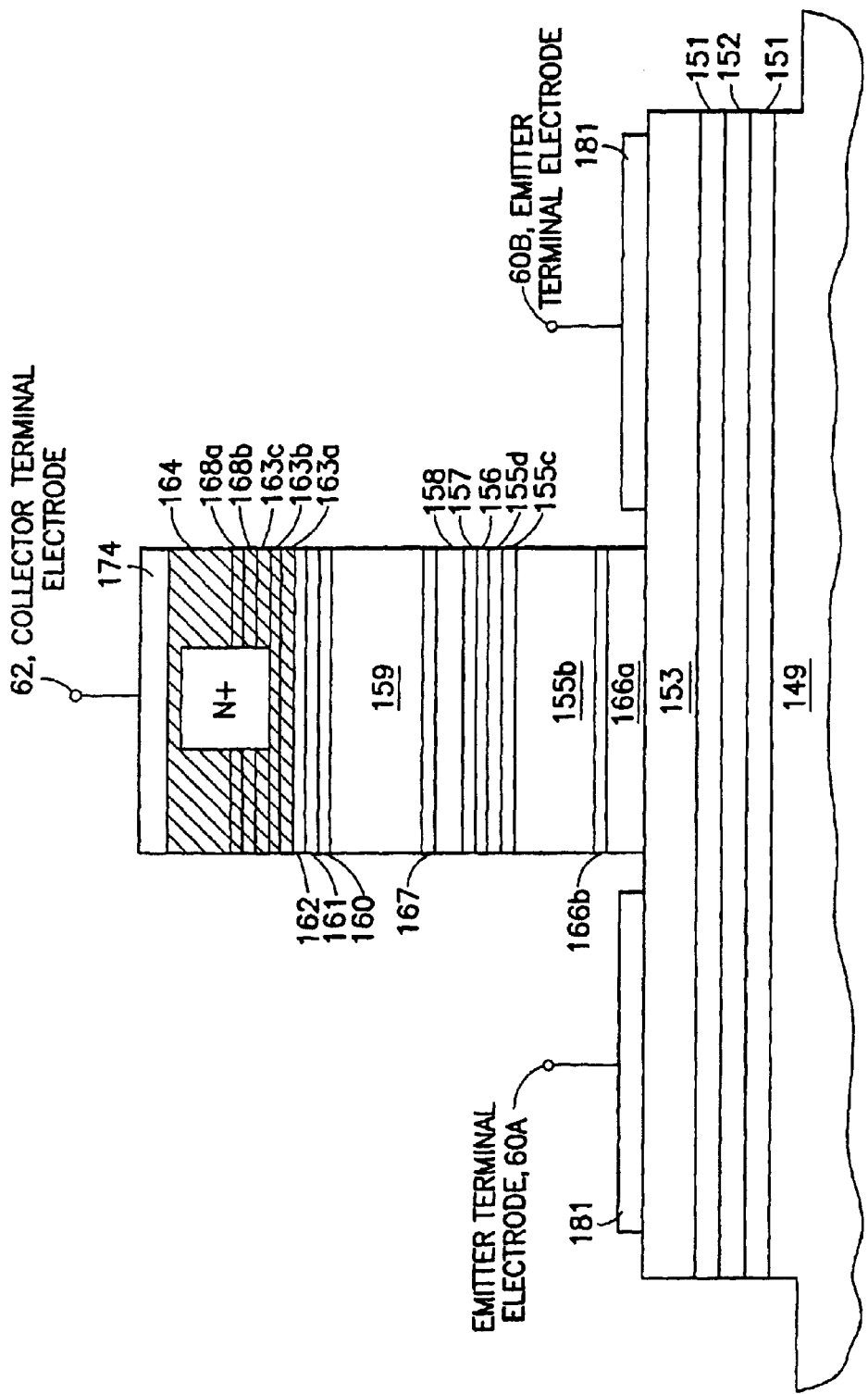
FIG.8C2

SEMICONDUCTOR DEVICES EMPLOYING AT LEAST ONE MODULATION DOPED QUANTUM WELL STRUCTURE AND ONE OR MORE ETCH STOP LAYERS FOR ACCURATE CONTACT FORMATION

CROSS-REFERENCE TO RELATED APPLICATION

This application is a continuation-in-part of U.S. application Ser. No. 10/280,892, filed Oct. 25, 2002, entitled "Optoelectronic Device Employing At Least One Semiconductor Heterojunction Thyristor For Producing Variable Electrical/Optical Delay," commonly assigned to assignee of the present invention, and herein incorporated by reference in its entirety.

BACKGROUND OF THE INVENTION

1. Field of the Invention

This invention relates broadly to field of semiconductor devices (and associated fabrication methodology) and, in particular, to semiconductor devices (and associated fabrication methodology) that utilize modulation doped quantum well heterojunctions to realize optoelectronic/electronic devices.

2. State of the Art

Modulation-doped quantum well heterojunction transistors—including well known Pseudomorphic Pulsed Doped High Electron Mobility Transistors (Pulsed Doped PHEMT), which are sometimes referred to as Pulsed Doped Modulation Doped Field Effect Transistors (Pulsed Doped MODFET) or Pulsed Doped Two Dimensional Gas Field Effect Transistors (Pulsed Doped TEGFET)—have become well recognized for their superior low noise and high frequency performance and are now in demand in many high frequency applications (e.g., front end amplifier in wireless communications systems and in Monolithic Microwave and Millimeterwave IC (MMIC) designs).

GaAs/InGaAs/AlxGa$_{1-x}$As is the III–V material system of choice for these devices because of the ability to grow high optical/electrical quality epitaxial layers by molecular beam epitaxy (MBE). Alternatively, strained silicon heterostructures employing silicon-germanium (SiGe) layers have been used to produce such devices.

U.S. Pat. No. 4,827,320 to Morkoc et al. discloses a pseudomorphic HEMT (PHEMT) structure that employs a layer of strained InGaAs (undoped) between a GaAs substrate and a layer of undoped AlGaAs to form a quantum well (QW) defined by the strained InGaAs layer. A layer of n+ doped AlGaAs is formed on the undoped AlGaAs layer. A layer of n+ GaAs is formed on the layer of n+ doped AlGaAs. The layer of n+ GaAs facilitates an ohmic contact to source/drain electrodes. A gate electrode of aluminum is recessed below the layer of n+ GaAs and a portion of the n+ AlGaAs layer by wet chemical etch and evaporation of aluminum.

The PHEMT structure has been very successful in producing microwave transistors that operate well into the multi-gigahertz regime, initially being used extensively in military systems and now finding their way into commercial products, particularly in the area of cellular communications. In recent years, there has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser, PIN diode, etc.

To achieve this goal, inversion channel heterojunction structures created from a single epitaxial growth have been used to realize a range of optoelectronic devices including lasers, detectors and field effect transistors (FETs). An exemplary inversion channel heterojunction structure is described in Taylor and Kiely, "Theoretical and Experimental Results for the Inversion Channel Heterostructure Field Effect Transistors", IEE Proceedings-G, Vol.140, No.6, December 1993. In this structure, for the region between the modulation doping layer and the gate of the semiconductor surface, the doping of this region is substantially p type in order to provide a low resistance ohmic contact for the gate of the FET.

However, the high p-type doping of this region creates many problems, including:

i) the effects of free carrier absorption makes formation of a vertical cavity laser difficult;

ii) forming a depletion-type FET by implanting n-type dopant is difficult; this difficulty stems from the difficulty in controlling the dopant density in the bulk region; more specifically, compensating a large p density with a large n density to obtain a lower p density is difficult to control in a bulk region (but much easier in a delta doped region);

iii) controlling the threshold voltage of an enhancement type FET is difficult because the input capacitance is a function of doping which is harder to control than layer thickness; and iv) producing effective current funneling for inducing lasing is difficult; more specifically, it is very desirable to create a pn junction by N type implantation to steer the current in this structure since this would be compatible with the overall approach to building the FET devices; the heavy p doping bulk layers makes it difficult to create junction isolation that has low leakage.

Heterojunction Bipolar Transistor (HBT) devices have also been developed for high frequency applications. An HBT device includes a base layer structure disposed between an emitter layer structure and a collector layer structure. The base layer structure may utilize a graded composition (as described in U.S. Pat. No. 6,037,616) or a modulation doped QW structure (as described in U.S. Pat. No. 5,003,366). A transferred-substrate process may be used wherein the emitter is epitaxially grown on a substrate, and the collector is apitaxially grown on the top of the sample. By depositing the collector as a small feature on the top surface of the sample and etching a collector mesa, a minimum collector capacitance is realized. At this point, the sample is flipped and mounted on a low resistance ground plane, and the substrate below the emitter is removed by etching so that processing of the emitter and base can begin in a conventional manner from the top side. An exemplary transferred-substrate process for HBTs is described in D. Mensa et al., "Transferred-substrate HBTs with 254 GHz $F_T$," Electron. Lett., April 1999, 35(7), pp. 605–606. These prior art devices provide for improved current gain and cutoff frequency with respect to prior art silicon bipolar transistors. However, it is difficult to realize a range of optoelectronic devices (including lasers, detectors, FET devices, waveguide devices) from the epitaxial growth that is used to form such HBT devices.

SUMMARY OF THE INVENTION

It is therefore an object of the invention to provide a single layer structure which can be used to realize within a single integrated circuit chip a wide range of optoelectronic devices (including lasers, detectors, FET devices, bipolar transistor devices, waveguide devices).

Another object of the invention is to provide fabrication methodology that operates on the single layer structure to produce a heterojunction thyristor device that can be adapted to operate as a laser, optical detector, optically (or electrically) controlled sampling switch, or optical modulator.

Another object of the invention is to provide fabrication methodology that operates on the single layer structure to produce complementary HFET devices with n-channel and p-channel control elements respectively.

Another object of the invention is to provide fabrication methodology that operates on the single layer structure to produce complementary quantum-well-base bipolar transistors with n-channel and p-channel control elements respectively.

Another object of the invention is to provide vertical cavity optoelectronic devices in addition to lasers, detectors, modulators, amplifiers and switches that are interconnected by low loss passive waveguides in the plane of the integrated circuit.

In accord with these objects, which will be discussed in detail below, a semiconductor device (and corresponding fabrication methodology) includes a novel series of layers formed on a substrate. The layers include a first plurality of layers including an n-type ohmic contact layer, a second plurality of layers forming a p-type modulation doped quantum well structure, a third plurality of layers forming an n-type modulation doped quantum well structure, and a fourth plurality of layers including a p-type ohmic contact layer. The first plurality of layers preferably include a first etch stop layer that is used to form contacts to the n-type ohmic contact layer. The fourth plurality of layers preferably include a second etch stop layer that is used to form contacts to the n-type modulation doped quantum well. Undoped spacer layers are preferably disposed between the first and second plurality of layers, between the second and third plurality of layers, and between the third and fourth plurality of layers.

Preferably, each such etch stop layer is made sufficiently thin to enable current tunneling therethrough during operation of optoelectronic/electronic devices realized from this structure (including heterojunction thyristor devices, n-channel HFET devices, p-channel HFET devices, p-type quantum-well-base bipolar transistor devices, and n-type quantum-well-base bipolar transistor devices).

Electrodes that contact the n-type ohmic contact layer are formed by an etching operation that automatically stops at the first etch stop layer. Remaining portions of the first etch stop layer are removed to expose first areas of the n-type ohmic contact layer. A first metal layer is deposited on the first areas of the n-type ohmic contact layer to form such electrodes.

Electrodes that contact the n-type quantum-well structure are formed by an etching operation that automatically stops at the second etch stop layer. Remaining portions of the second etch stop layer are removed to expose second areas of a layer thereunder. N-type ions are implanted into these second areas to form at least one n-type implant region that is operably coupled to the n-type modulation doped quantum well structure. At least one metal layer is deposited on the n-type implant region to form such electrodes.

The etch stop layer(s) preferably comprise AlAs that functions as an etch stop during etching by a chlorine-based gas mixture that includes fluorine. The series of layers may comprise group III–V materials or strained silicon heterostructures employing silicon-germanium (SiGe) layers.

In another aspect of the present invention, a high performance bipolar transistor device is realized from this structure by implanting p-type ions in a interdigitization pattern that forms a plurality of p-type ion implant regions on both sides of the p-type modulation doped quantum well structure to a depth that penetrates the n-type ohmic contact layer. A base terminal electrode is operably coupled to the p-type modulation doped quantum well structure by the plurality of p-type ion implant regions. An emitter terminal electrode is operably coupled to the n-type ohmic contact layer. The emitter terminal electrode comprises a patterned metal layer formed on regions of the n-type ohmic contact layer, such regions including portions between the p-type implant regions. The interdigitization pattern of the p-type implants reduces capacitance between the p-type modulation doped quantum well structure and the n-type ohmic contact layer to enable higher frequency operation.

Additional objects and advantages of the invention will become apparent to those skilled in the art upon reference to the detailed description taken in conjunction with the provided figures.

BRIEF DESCRIPTION OF THE DRAWINGS

FIG. 1B is a schematic showing an exemplary layer structure made with group III–V material in accordance with the present invention, and from which devices of the present invention can be made;

FIGS. 5B and 5C are cross-sectional schematic views showing the generalized construction of exemplary p-type quantum-well-base bipolar transistor devices formed from the layer structure of FIG. 2A;

FIGS. 8A, 8B1, 8B2 8C1, and 8C2 illustrate two exemplary p-type quantum-well-base transistor devices that are realized by interdigitization of the P+-type implants 171 on both sides of the collector metal layer 174; FIG. 8A is a top view of the device structure for the two exemplary p-type quantum-well-base transistor devices; FIG. 8B1 illustrates the cross-section A—A of FIG. 8A of the first exemplary p-type quantum-well-base transistor device; FIG. 8B2 illustrates the cross-section B—B of FIG. 8A of the first exemplary p-type quantum-well-base transistor device; FIG. 8C1 illustrates the cross-section A—A of FIG. 8A of the second exemplary p-type quantum-well-base transistor device; and FIG. 8C2 illustrates the cross-section B—B of FIG. 8A of the second exemplary p-type quantum-well-base transistor device.

DETAILED DESCRIPTION OF THE PREFERRED EMBODIMENTS

The present invention builds upon novel device structures utilizing modulation-doped QW heterojunctions that do not suffer from the problems associated with the prior art PHEMT devices and HBT. Such novel device structures are described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. patent application Ser. No. 60/376,238, filed on Apr. 26, 2002; and U.S. application Ser. No. 10/280,892, filed on Oct. 25, 2002; each of these references herein incorporated by reference in its entirety.

Figure 1A:
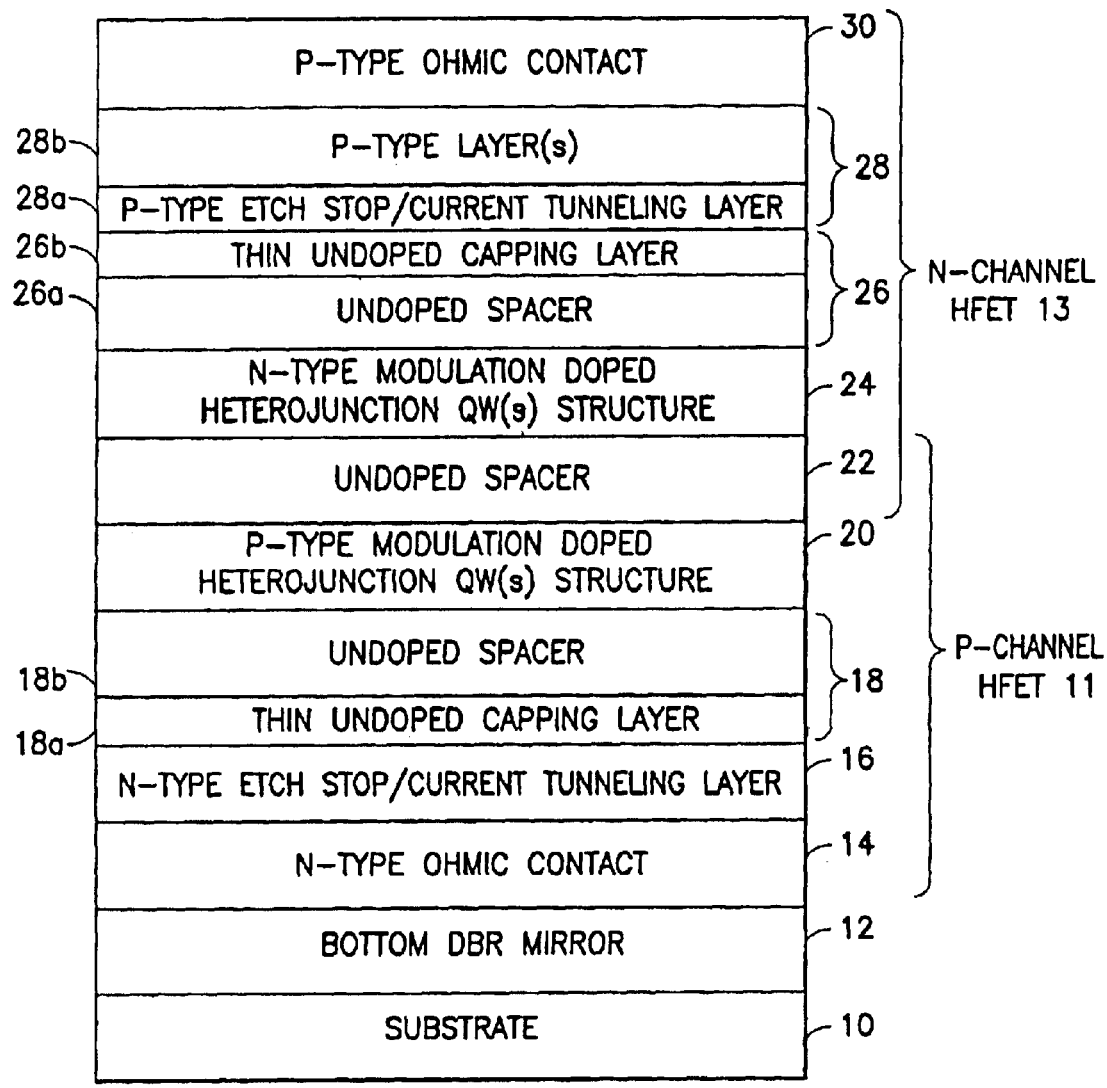
FIG. 1A is a cross-sectional schematic showing a layer structure in accordance with the present invention, and from which devices of the present invention can be made.

Turning now to FIG. 1A, a multi-layer sandwich structure in accordance with the present invention, and from which devices of the present invention can be made, includes a bottom dielectric distributed bragg reflector (DBR) mirror 12 formed on a substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\frac{1}{4}$n) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure which consists of two HFET devices. The first of these is a p-channel HFET 11 (comprising layers 14,16,18,20 and 22) which has one or more p-type modulation doped QWs and is positioned with the gate terminal on the lower side (i.e. on the bottom DBR mirror 12) and the collector terminal on the upper side. The second of these is an n-channel HFET 13 (comprising layers 22,24,26,28,30) which has one or more n-type modulation doped QWs and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 14 which enables the formation of ohmic contacts thereto. Deposited on layer 14 is an n-type layer 16 which serves as an etch stop layer when forming contacts to the ohmic contact layer(s) 14. Layer 16 is also made sufficiently thin to enable current tunneling therethrough during operation of optoelectronic/electronic devices realized from this structure. The thickness of layer 16 may be adjusted to set the desired current gain of a p-type quantum-well-base bipolar transistor realized from this structure as described below. Preferably, the doping of this layer 16 is such that it should not be depleted in any range of operation of the device, i.e. the total doping in this layer should exceed the total doping charge contained in the modulation doped layer of the p-type modulation doped QW structure 20 described below. In this configuration, layer 14 achieves low contact resistance and layer 16 defines the capacitance of the p-channel HFET 11 with respect to the p-type modulation doped QW heterostructure 20. This layer 16 also serves optically as a small part of the lower waveguide cladding for optical devices realized in this structure. Note that a majority of the lower waveguide cladding is provided by the lower DBR mirror 12 itself Deposited on layer 16 is an undoped layer 18. The undoped layer 18 preferably includes a thin undoped capping layer 18a and an undoped spacer layer 18b. Capping layer 18a serves to prevent oxidation of layer 16 during subsequent manufacturing operations. Layers 14, 16 and 18 serve electrically as part of the gate of the p-channel HFET 11. Deposited on layer 18 is a p-type modulation doped QW structure 20 that defines one or more quantum wells (which may be formed from strained or unstrained heterojunction materials). Deposited on the p-type modulation doped QW structure 20 is an undoped spacer layer 22, which forms the collector of the P-channel HFET device 11. All of the layers grown thus far form the P-channel HFET device 11 with the gate ohmic contact on the bottom.

Undoped spacer layer 22 also forms the collector region of the N-channel HFET device 13. Deposited on layer 22 is a n-type modulation doped QW structure 24 that defines one or more quantum wells (which may be formed from strained or unstrained heterojunction materials). Deposited on the n-type modulation doped QW structure 24 is an undoped layer 26, which preferably includes an undoped spacer layer 26a and a thin undoped capping layer 26b. Capping layer 26b serves to prevent oxidation of layer 26a during subsequent manufacturing operations. Deposited on layer 26 is a p-type layer structure 28, which includes layer 28a and at least one p-type layer 28b. Layer 28a serves as an etch stop layer when forming contacts to the n-type inversion channel(s) of the NHFET device 13. Layer 28a is also made sufficiently thin to enable current tunneling therethrough during operation of optoelectronic/electronic devices realized from this structure. The thickness of layer 28a may be adjusted to set the desired current gain of an n-type quantum-well-base bipolar transistor realized from this structure as described below. Preferably, the doping of this layer 28a is such that it should not be depleted in any range of operation of the device, i.e. the total doping in this layer should exceed the total doping charge contained in the modulation doped layer of the n-type modulation doped QW structure 24 described above. Layer structure 28 also serves optically as a small part of the upper waveguide cladding for optical devices realized in this structure. Note that a majority of the upper waveguide cladding is provided by the upper DBR mirror (not shown). Deposited on the p-type layer structure 28 is a p-type ohmic contact layer(s) 30 which enables the formation of ohmic contacts thereto. Layers 26, 28 and 30 serve electrically as part of the gate of the n-channel HFET 13. In this configuration, layer 30 achieves low contact resistance and layer 28a defines the capacitance of the n-channel HFET 13 with respect to the n-type modulation doped QW heterostructure 24.

Alternatively, the active device structure may be described as a pair of stacked quantum-well-base bipolar transistors formed on the bottom DBR mirror 12. The first of these is an n-type quantum-well-base bipolar transistor (comprising layers 14, 16, 18, 20 and 22) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 22, 24, 26, 28, 30) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the gate terminal of the p-channel HFET device 11 corresponds to the emitter terminal of the p-type quantum-well-base bipolar transistor, the p-type QW structure 20 corresponds to the base region of the p-type quantum-well-base bipolar transistor, spacer layer 22 corresponds to the collector region of both the p-type quantum-well-based bipolar transistor and the n-type quantum-well-base bipolar transistor, the n-type QW structure 24 corresponds to the base region of the n-type quantum-well-base bipolar transistor, and the gate terminal of the n-channel HFET device 13 corresponds to the emitter electrode of the n-type quantum-well-base bipolar transistor.

To form a resonant cavity device where light is input into and emitted from the device laterally (i.e., from a direction normal to the cross section of FIG. 1A), a diffraction grating and top DBR mirror are formed over the active device structure described above. For vertical cavity lasing devices, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity.

Alternatively, light may enter and exit the resonant vertical cavity through an optical aperture (not shown) in the top surface of the device. In this case, the diffraction grating is omitted, the top DBR mirror defines a cavity for the vertical emission and absorption of light, and the device operates as a vertical cavity surface emitting laser/detector.

The distance between the top DBR mirror and bottom DBR mirror preferably represents an integral number of ½ wavelengths at the designated wavelength. This distance is controlled by adjusting the thickness of one or more of the layers therebetween to enable this condition.

The multilayer structure described above may be realized with a material system based on group III–V materials (such as a GaAs/AlGaAs). Alternatively, strained silicon heterostructures employing silicon-germanium (SiGe) layers may be used to realize the multilayer structures described herein. FIG. 1B illustrates an exemplary epitaxial growth structure utilizing group III–V materials for realizing the multilayer structure of FIG. 1A and the optoelectrical/electrical/optical devices formed from this structure in accordance with the present invention. The structure of FIG. 1B can be made, for example, using known molecular beam epitaxy (MBE) techniques. As shown, a first semiconductor layer 151 of AlAs and a second semiconductor layer 152 of GaAs are alternately deposited (with preferably at least seven pairs) upon a semi-insulating gallium arsenide substrate 149 in sequence to form the top dielectric distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 11, which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the cathode terminal of a heterojunction thyristor device, the gate terminal of an inverted p-channel HFET device, the sub-collector terminal of an n-channel HFET device, or the emitter terminal of a p-type quantum-well-base bipolar device). Layer 153 has a typical thickness of 1000–2000 Å and a typical n-type doping of $3.5 \times 10^{18}$ cm$^{-3}$. The N+ doped GaAs layer 153 corresponds to the ohmic contact layer 14 of FIG. 1A. Deposited on layer 153 is a layer 166a of n-type AlAs having a typical thickness of 30–200 Å and a typical n-type doping of $3.5 \times 10^{18}$ cm$^{-3}$. One constraint upon the thickness and the doping of this layer 166a is that it should not be depleted in any range of operation of the device, i.e. the total doping in this layer should exceed the total doping charge contained in the layer 155c described below. This layer 166a serves optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. In addition, layer 166a also acts as an etch stop layer (described below in more detail) when forming contacts to the ohmic contact layer 153. Another constraint on the thickness of layer 166a is that it must be made sufficiently thin to enable hole current to flow through it by tunneling. In this manner, the thickness of layer 166a determines the current gain of an inverted p-type quantum-well-base bipolar transistor realized in this growth structure. Next is a layer 166b of undoped GaAs having a typical thickness of 6–20 Å. This layer 166b serves to prevent oxidation of the layer 166a during subsequent oxidation operations (e.g., where the bottom DBR mirror layers 151/152 are oxidized). In addition, undoped GaAs layer 166b is advantageous in a single aluminum effusion cell MBE system because it accommodates a growth interruption to change the growth temperature between layers 166a and 155b as required.

Next are three layers (155b, 155c, and 155d) of $Al_{x2}Ga_{1-x2}As$. These three layers have a total thickness about 300–500 Å and where x2 is about 15%. The first layer 155b is about 200–300 Å thick and is undoped. The second layer 155c is about 80 Å thick and is doped P+ type in the form of delta doping with a typical concentration of $3.5 \times 10^{18}$ cm$^{-3}$. And the third layer 155d is about 20–30 Å thick and is undoped. The layers 155d and 166b form the lower separate confinement heterostructure (SCH) layer for the laser, amplifier and modulator devices. The N+ AlAs layer 166a corresponds to the n-type layer 16 of FIG. 1A, and the undoped GaAs layer 166b and the undoped AlGaAs layer 155b corresponds to the undoped spacer layer 18 of FIG. 1A. To realize a p-type quantum-well-base bipolar transistor (and/or a p-channel HFET) with a cutoff frequency of about 40 GHz, the combined thickness of layers 166b and 155b is preferably on the order of 300 Å. And to realize a p-type quantum-well-base bipolar transistor (and/or a p-channel HFET) with a cutoff frequency of about 90 GHz, the combined thickness of layers 166b and 155b is preferably on the order of 250 Å.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 (that is about 40–80 Å thick) and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 µm, the nitrogen content will be 0%; for a natural emission frequency of 1.3 µm, the nitrogen content will be approximately 2%; and for a natural emission frequency of 1.5 µm, the nitrogen content will be approximately 4–5%. The well-barrier combination will typically be repeated (for example, three times as shown) to define the quantum wells that form the inversion channels during operation of the PHFET 11 (however single quantum well structures are also possible). Unstrained quantum wells are also possible. Following the last barrier of undoped GaAs is a layer 167 of undoped GaAs and a layer 159 of undoped $Al_{x2}Ga_{1-x2}As$. The undoped GaAs layer 167 has a typical thickness of 250–500 Å, and the undoped $Al_{x2}Ga_{1-x2}As$ layer 159 has a typical thickness of 0.5 µm. These layers 167 and 159 form the collector of the PHFET device 11. The purpose of the GaAs layer 167 is to accommodate a change in the growth temperature from about 530° C. (as required for the InGaAs quantum well structure of layer 157) to about 610° C. (as required for $Al_{x2}Ga_{1-x2}As$ layer 159). Layer 167 performs no electrical purpose and so it should be electrically totally transparent to all current flows. Therefore, layer 167 is thin enough that currents may pass through it by tunneling with negligible voltage drop. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 2A. Undoped GaAs layer 167 and undoped AlGaAs layer 159 correspond to the undoped spacer layer 22 of FIG. 1A.

Layers 167 and 159 also form the collector region of the NHFET device 13. Deposited on layer 159 is a layer 160 (shown as two sublayers 160a, 160b) of undoped GaAs of about 200–250 Å total thickness, which form the barrier of the first n-type quantum well. Layer 160 is thicker than the normal barrier layer (layer 160b) of about 100 Å because it accommodates the growth interruption to change the growth temperature from 610° C. (as required for optical quality $Al_{x2}Ga_{1-x2}As$ layers) to about 530° C. for the growth of InGaAs. The next layer 161 is the quantum well of $In_{0.2}Ga_{0.8}As$, which is undoped and about 40–80 Å in thickness. The quantum well layer 161 may be comprised of a range of compositions as described above with respect to the quantum well layer 157. In the preferred embodiment, the quantum well is formed from an $In_{0.2}Ga_{0.8}AsN$ composition with the nitrogen content varying from 0% to 5% depending upon the desired natural emission frequency. It is noted that the n-type quantum well layer 161 need not be of the same formulation as the p-type quantum well layer 157. The barrier-well combination (layers 160b, 161) will typically be repeated (for example, three times as shown) to define the quantum wells that form the inversion channel(s) during operation of the NHFET 13. Then there is a top barrier layer 162 of about 10–30 Å of undoped GaAs which accommodates a growth interruption and a change of growth temperature.

Next there are three layers (163a, 163b, 163c) of $Al_{x2}Ga_{1-x2}As$ of about 300–400 Å total thickness. These three layers include a spacer layer 163a of undoped $Al_{x2}Ga_{1-x2}As$ that is about 20–30 Å thick, a modulation doped layer 163b of N+ type doping of $Al_{x2}Ga_{1-x2}As$ (with doping about $3.5 \times 10^{18}$ cm$^{-3}$) that is about 80 Å thick, and a spacer layer 163c of undoped $Al_{x2}Ga_{1-x2}As$ that is about 200–300 Å thick. Next is a layer 168a of undoped GaAs that is about 6–20 Å thick, and a P+ type doped layer 168b of AlAs (with doping about $3.5 \times 10^{18}$ cm$^{-3}$) that is about 300 Å. In contrast to layer 163b which is always depleted, layer 168b should never be totally depleted in operation (i.e., the total doped charge in layer 168b should always exceed that in layer 163b). Layers 168b and 163b (and the undoped spacer layers 163c and 168a therebetween) form the two plates of a parallel plate capacitor which forms the field-effect input to all active devices. For the optoelectronic device operation, layer 163a is the upper SCH region. Layer 168b also acts as a etch stop layer (described below in more detail) when forming contacts to the N-type inversion channel(s) of the NHFET 13 (for example, when contacting to the N-channel injector terminal(s) of a heterojunction thyristor device, the source/drain terminals of an n-channel HFET device, the base terminal of an n-type quantum-well-base bipolar transistor, or the collector terminal of a p-type quantum-well-base bipolar transistor). Moreover, similar to layer 166b, layer 168a must be made sufficiently thin to enable electron current to flow through it by tunneling. In this manner, the thickness of this layer 168a determines the current gain of a n-type quantum-well-base bipolar transistor device realized in this growth structure. In addition, because layer 168a is thin, it does not easily oxidize during subsequent oxidation operations (e.g., where the bottom DBR mirror layers are oxidized). Further, undoped GaAs layer 168a is advantageous in a single aluminum effusion cell MBE system because it accommodates a growth interruption to change the growth temperature between layers 163c and 168b as required. The layers between the undoped GaAs barrier layer 160a and the N+ AlGaAs layer 163b correspond to the n-type modulation doped heterojunction QW structure 24 of FIG. 1A. Undoped AlGaAs layer 163c and undoped GaAs layer 168a corresponds to the undoped spacer layer 26 of FIG. 1A. To realize an n-type quantum-well-base bipolar transistor (and/or an n-channel HFET) with a cutoff frequency of about 40 GHz, the combined thickness of layers 163c and 168a is preferably on the order of 300 Å. To realize an n-type quantum-well-base bipolar transistor (and/or an n-channel HFET) with a cutoff frequency of about 90 GHz, the combined thickness of layers 163c and 168a is preferably on the order of 250 Å.

A layer 164 of p-type GaAs is deposited next to form part of the upper waveguide cladding layer for the laser, amplifier and modulator devices. Note that a majority of the upper waveguide cladding for waves propagating in the guide formed by the optically active region of the device is provided by the upper DBR mirror itself. The upper DBR mirror causes the light to be guided partially as a dielectric waveguide and partially as a mirror waveguide. Layer 164 also forms a spacer layer in which to accommodate the aperture implants which steers the current into the VCSEL active region. It should provide a low resistance access to the top contact. It has a typical thickness of 300 Å. The p-type layers 168b and 164 correspond to the p-type layer(s) 28 of FIG. 1A.

Deposited next is an ohmic contact layer 165 (which may comprise a single layer of GaAs or a combination of GaAs (165a) and InGaAs (165b) as shown). In the illustrative embodiment shown, the GaAs layer 165a is about 50–100 Å thick and doped to a very high level of P+ type doping (about $1 \times 10^{20}$ cm$^{-3}$) and the InGaAs layer 165b is about 25–50 Å thick and doped to a very high level of P+ type doping (about $1 \times 10^{20}$ cm$^{-3}$) to enable the best possible ohmic contact.

Alternatively, the active device structure may be described as a pair of stacked quantum-well-base bipolar transistors formed on the bottom DBR mirror (layers 151/152). The first of these is a p-type quantum-well-base bipolar transistor (comprising layers 153 through 159) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the gate terminal of the PHFET 11 corresponds to the emitter terminal of the p-type quantum-well-base bipolar transistor, the p-type QW structure (layers 155c though 158) corresponds to the base region of the p-type quantum-well-base bipolar transistor, spacer layer 159 corresponds to the collector region of both the p-type quantum-well-base bipolar transistor and the n-type quantum-well-base bipolar transistor, the n-type QW structure (layers 160a through 163b) corresponds to the base region of the n-type quantum-well-base bipolar transistor, and the gate terminal of the NHFET 13 corresponds to the emitter electrode of the n-type quantum-well-base bipolar transistor.

Figure 1C:
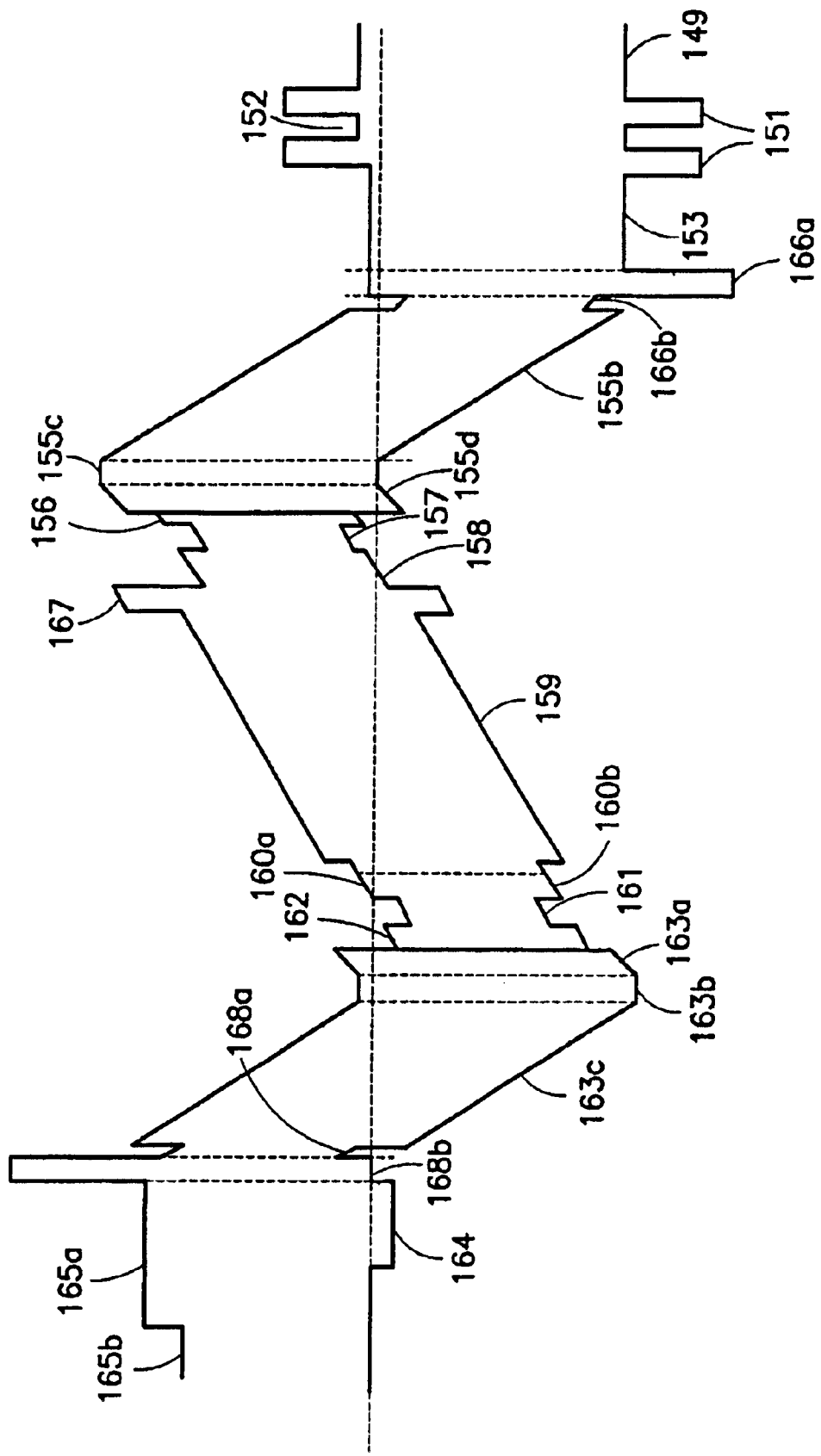
FIG. 1C shows the energy band diagram of the structure of FIG. 1B.

The band diagram of the FIG. 1B structure is shown in FIG. 1C.

To form a resonant cavity device where light is input into and emitted from the device laterally (i.e., from a direction normal to the cross section of FIG. 1B), a diffraction grating (for example, as described in detail in U.S. Pat. No. 6,031, 243) and top DBR mirror is formed over the active device structure described above. For vertical cavity lasing devices, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ½ wavelengths at the designated wavelength. Preferably, the thickness of layer 164 and/or layer 159 is adjusted to enable this condition.

The structure of FIGS. 1A and 1B may also be used to realize various optoelectronic devices, including heterojunction thyristor devices, an array of transistor devices (including n-channel HFET devices, p-channel HFET devices, n-type quantum-well-base bipolar transistors and p-type quantum-well-base bipolar transistors), and waveguide devices.

Figure 2A:
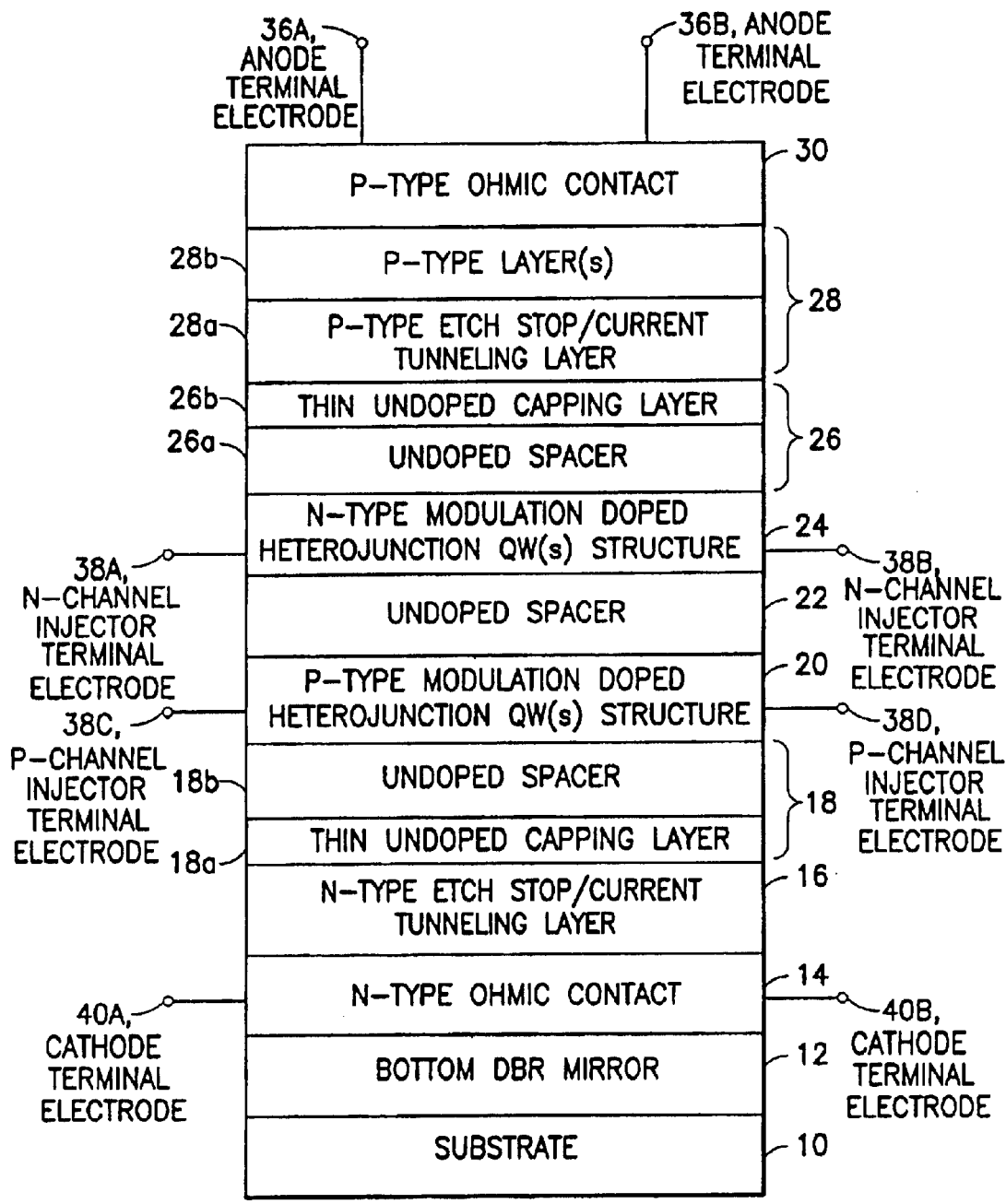
FIG. 2A is a cross-sectional schematic view showing the generalized construction of an exemplary heterojunction thyristor device formed from the layer structure of FIG. 1A.

FIG. 2A illustrates an exemplary heterojunction thyristor device realized from the multilayer sandwich of FIG. 1A. As shown, one or more anode terminal electrodes (two shown as 36A and 36B) are operably coupled to the p-type ohmic contact layer 30, one or more n-channel injector terminal electrodes (two shown as 38A, 38B) are operably coupled to the n-type QW structure 24, one or more p-channel injector terminal electrodes (two shown as 38C, 38D) are operably coupled to the p-type QW structure 20, and one or more collector terminal electrodes (two shown as 40A, 40B) are operably coupled to the n-type ohmic contact layer 14. When forming the heterojunction thyristor device via etching and metallization, etch stop layer 28a is used as an etch stop in order to form a contact that is electrically coupled to the n-type QW structure 24, which is subsequently metallized to form the n-channel injector terminal(s) (38A, 38B) that are electrically coupled to the n-type QW structure 24; and layer 16 is used as an etch stop layer in order to form a contact that is electrically coupled to the n-type ohmic contact layer 14, which is subsequently metallized to form the cathode terminal electrode(s) (40A, 40B) of the device.

In alternative embodiments, the p-channel injector terminals (38C, 38D) may be omitted. In such a configuration, the N-channel injector terminals (38A, 38B), which are coupled to the n-type inversion QW structure 24 are used to control charge in such n-type inversion QW channel(s) as described herein. In yet another alternative embodiment, the N-channel injector terminals (38A, 38B) may be omitted. In such a configuration, the p-channel injector terminals (38C, 38D), which are coupled to the p-type inversion QW structure 20 are used to control charge in such p-type inversion QW channel(s) as described herein.

Figure 2B:
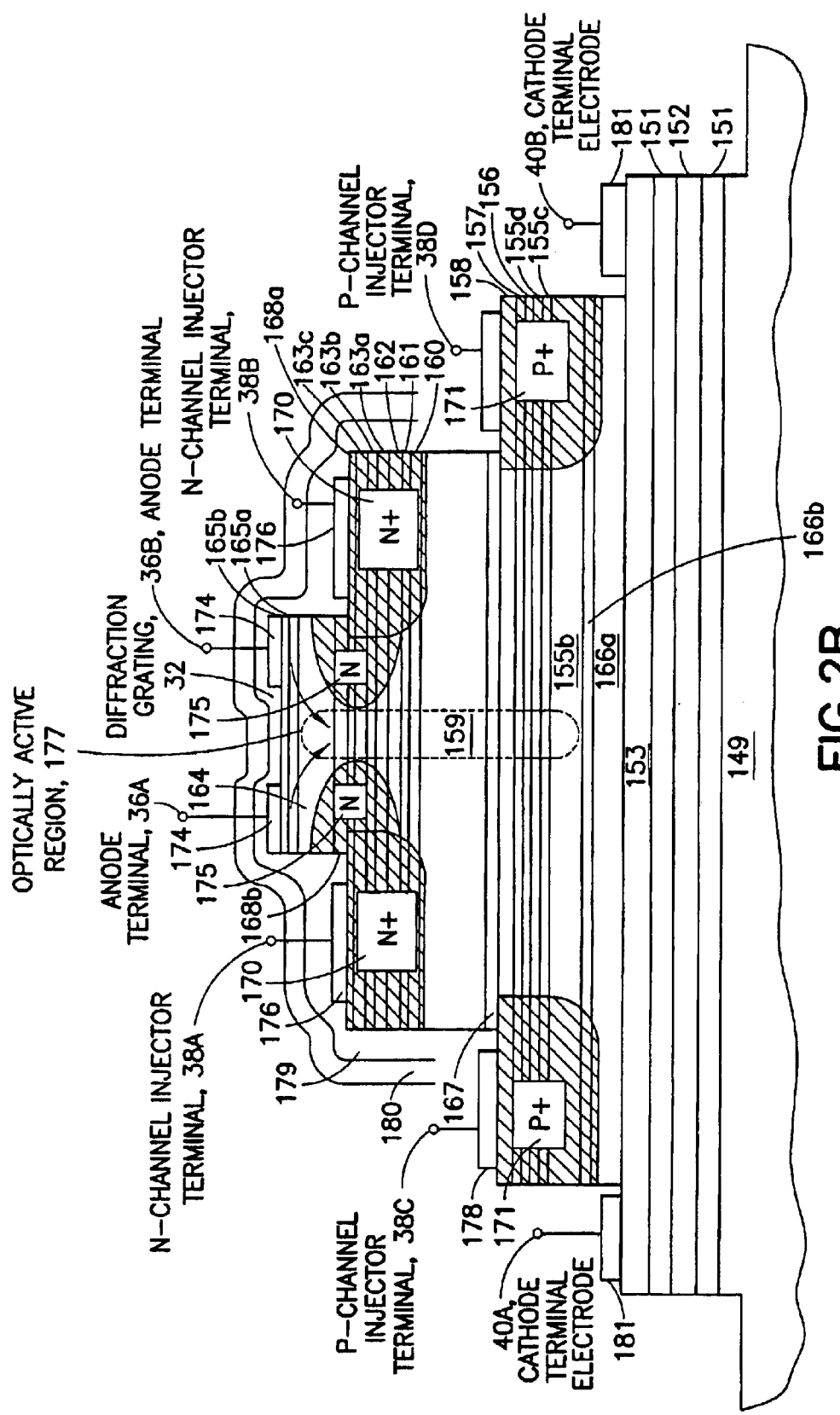
FIG. 2B is a cross-sectional schematic view showing the generalized construction of an exemplary heterojunction thyristor device formed from the layer structure of FIG. 2A.

FIG. 2B illustrates an exemplary heterojunction thyristor device realized from the multilayer sandwich of FIGS. 1B and 1C. To connect to the anode terminal of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Preferably, this dielectric layer also forms the first layer of the top DBR mirror. Then an ion implant 175 of n-type is performed using a photomask that is aligned to the alignments marks, and an optical aperture is defined by the separation between the implants 175. The implants 175 create a p-n junction in the layers between the n-type quantum well(s) and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 2B as arrows. For lasing applications, the laser threshold condition is reached before the voltage for turn-on of this barrier. Following the implant 175, a metal layer 174 (preferably comprising tungsten) is deposited and defined to form anode terminals 36A and 36B (which collectively form the anode terminal 36) of the device.

Then an ion implant 170 of n+-type is performed using the metal 174 as a mask that is self-aligned to the metal features, to thereby form contacts to the n-type QW inversion channel(s). During this operation, a chlorine-based gas mixture that includes fluorine is used as an etchant to etch down to the etch-stop layer 168b. The etch rate through the InGaAs layer 165b and GaAs layers (165a and 164) is fairly rapid. However, because of the presence of fluorine in the etchant, the etch rate decreases drastically when the AlAs layer 168b is encountered. This is because the AlAs layer 168b has a high percentage of Aluminum, which forms AlF in the presence of the etch mixture. The AlF deposits on the surface of the structure and prevents further etching (because it is non-volatile and not etched by any of the conventional etchants). In this manner, the AlAs layer 168b operates as an etch stop layer. This layer is then easily dissolved in de-ionized (DI) water or wet buffered hydrofluoric acid (BHF) to form mesas at the undoped GaAs layer 168a. The resulting mesas at the undoped GaAs layer 168a are subject to the N+ ion implants 170, which contact the n-type QW inversion channel(s).

Then an ion implant 171 of p+-type is performed using a photomask that is aligned to the alignments marks, to thereby form contacts to the p-type QW inversion channel(s). During this operation, a masking step is performed to protect all devices with N+ type inversion channels and the semiconductor is etched down to the bottom of layer 22 in FIG. 2A. This mask is aligned to metal features 174. Then the resulting mesas are subject to P+ ion implants 171, which electrically contact the P-type QW inversion channel(s).

In alternative embodiments, the P+ion implants 171 (and corresponding P-channel injector terminals 38C and 38D) may be omitted. In such a configuration, the N-channel injector terminals 38A and 38B (which are coupled to the n-type inversion QW channel(s) of the NHFET device 13 by the N+ ion implants 170) are used to control charge in such n-type inversion QW channel(s) as described herein. In yet another alternative embodiment, the N+ ion implants 170 (and corresponding N-channel injector terminals 38A and 38B) may be omitted. In such a configuration, the P-channel injector terminals 38C and 38D (which are coupled to the p-type inversion QW channel(s) of the PHFET 11 device by the P+ ion implants 171) are used to control charge in such p-type inversion QW channel(s) as described herein.

Connection to the cathode terminal (e.g., N+ layer 153) of the device is made by etching with a chlorine-based gas mixture that includes fluorine. This etch is performed down to the AlAs etch stop layer 166a. This layer 166a is then easily dissolved in de-ionized (DI) water or wet buffered hydrofluoric acid (BHF) to form resulting mesas in the N+ layer 153. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/ GaAs. At this point, the device is oxidized in a steam ambient to create layers 179/180, which form the top DBR mirror. During this oxidation step, the exposed sidewalls of the etched AlGaAs layers are passivated by the formation of very thin layers of oxide. The final step in the fabrication is the deposition (preferably via lift off) of metal contacts.

These contacts come in three forms. One is the metal layer 176 (preferably comprising an n-type Au alloy metal such as AuGe/Ni/Au) deposited on the N+ type implants 170 to form the N-channel injector terminal electrodes 38A, 38B. The second is the metal layer 178 (preferably comprising an p-type Au metal alloy such as AuZn/Cr/Au) deposited on the P+ type implant 171 to form the p-channel injector terminal electrodes 38C, 38D. The third is the metal layer 181 (preferably comprising an n-type Au alloy metal such as AuGe/Ni/Au) deposited on the mesas at the N+ layer 153 to form the cathode terminal electrodes 40A, 40B of the device.

To form a device suitable for in-plane optical injection into a resonant vertical cavity and/or in-plane optical emission from the resonant vertical cavity, a diffraction grating 32 (for example, as described in detail in U.S. Pat. No. 6,031,243) and top DBR mirror is formed in conjunction with the active device structure as described above. To form a device suitable for vertical optical injection into (and/or optical emission from) a resonant vertical cavity, the diffraction grating 32 is omitted. The top DBR mirror is preferably created by the deposition of one or more dielectric layer pairs (179,180), which typically comprise $SiO_2$ and a high refractive index material such as GaAs, Si, or GaN.

Figure 2C:
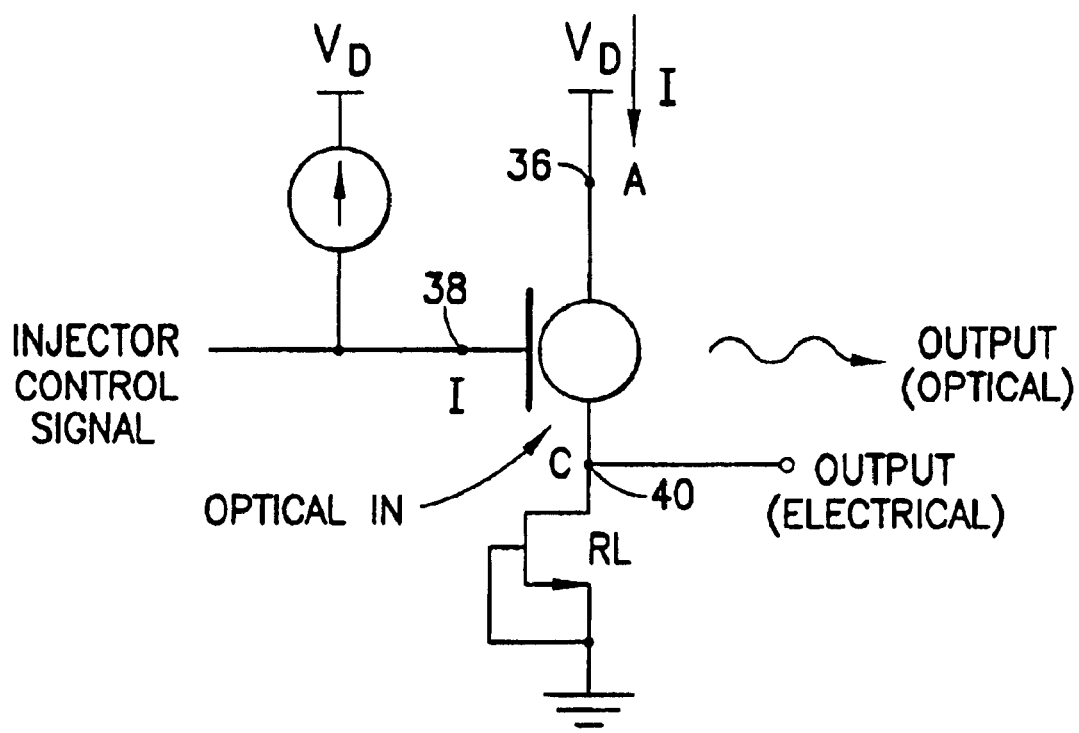
FIG. 2C is a pictorial illustration of an exemplary configuration of the heterojunction thyristor device of the present invention as an optoelectronic/electronic device.
Figure 2D:
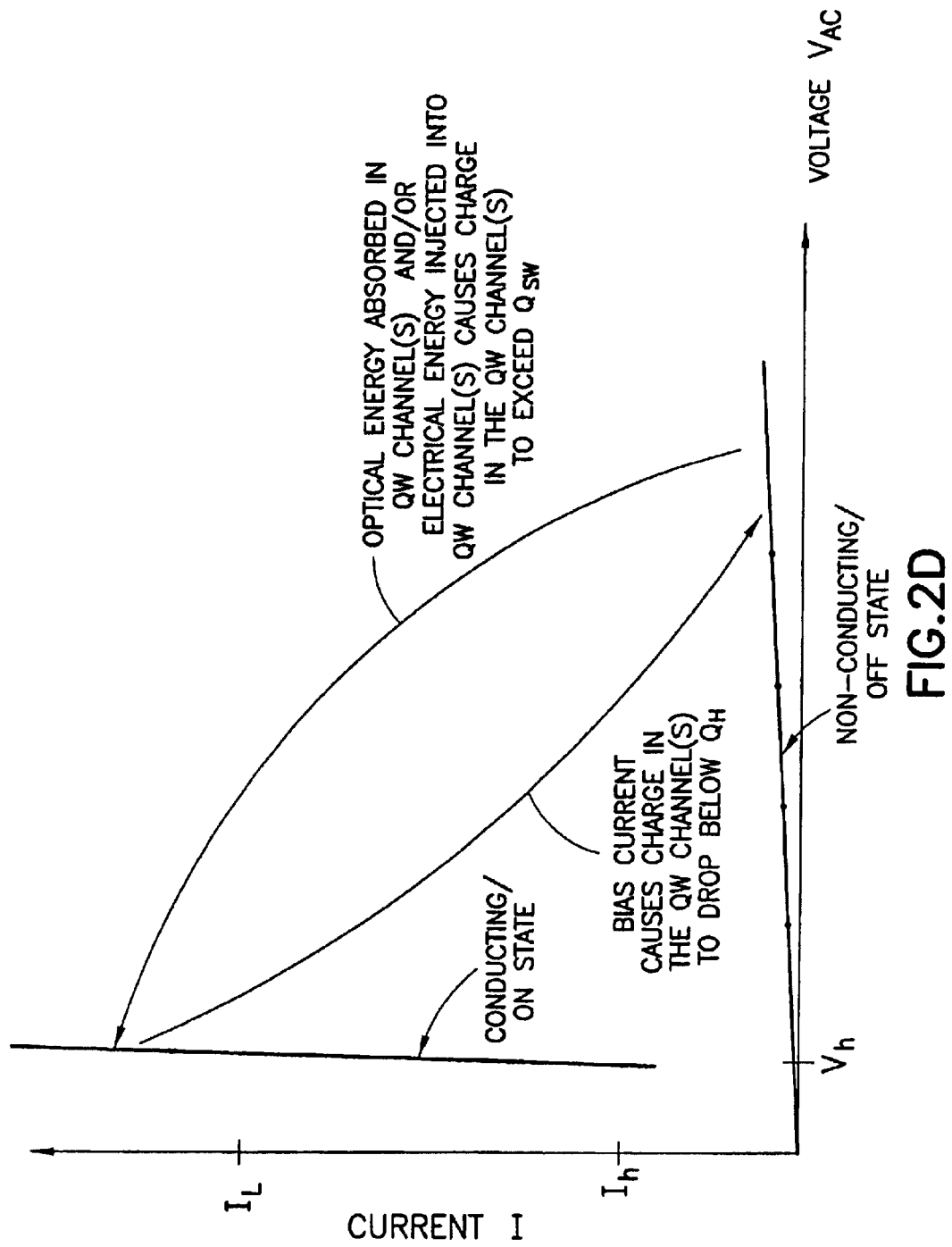
FIG. 2D is a graph showing the current-voltage characteristics of the heterojunction thyristor device in the NON-Conducting/OFF state of operation and the Conducting/ON state of operation, and the operational conditions that cause the heterojunction thyristor device to switch between the OFF state of operation and the ON state of operation.

FIGS. 2C and 2D illustrate the operational characteristics of the heterojunction thyristor devices of FIGS. 2A and 2B. The device switches from a non-conducting/OFF state (where the current I is substantially zero) to a conducting/ON state (where current I is substantially greater than zero) when: i) the anode terminal 36 is forward biased (e.g. biased positively) with respect to the cathode terminal 40; and ii) optical energy is supplied and resonantly absorbed in the QW channel(s) of the device and/or electrical energy is injected via the injector terminal 38 into the QW channel(s) of the device such that charge in the QW channel(s) is greater than the critical switching charge $Q_{CR}$, which is that charge that reduces the forward breakdown voltage such that no off state bias point exists. The critical switching charge $Q_{CR}$ is unique to the geometries and doping levels of the device. The device switches from the conducting/ON state to the non-conducting/OFF state when the charge in the QW channel(s) of the device decreases below the holding charge $Q_H$, which is the critical value of the channel charge which will sustain holding action.

As an optoelectronic component, the heterojunction thyristor devices of the present invention are multifunctional. For example, the devices can be configured to operate as a laser by biasing the device such that the current I in the conducting/ON state is above the threshold for lasing $I_L$ as shown in FIG. 2D. In such a configuration, the lasing action produces an output optical signal that is emitted from the device and a corresponding output electrical signal as shown in FIG. 2C. Such lasing action can be triggered by an optical control signal resonantly absorbed in the QW channel(s) of the device and/or an electrical control signal injected into the QW channel(s) of the device.

The heterojunction thyristor devices of the present invention can also be configured to operate as an optical detector by biasing the devices such that incident light will be resonantly absorbed and switch the device into its ON state, which produces an output electrical signal as shown in FIG. 2C. In the ON state, the device may produce a corresponding output optical signal via lasing action if the device is biased such that the current I in the ON state is above the threshold for lasing $I_L$.

In addition, the heterojunction thyristor devices of the present invention can be configured to operate as an optically-controlled (or electrically-controlled) sampling device (e.g., sampling switch) wherein an input terminal is selectively coupled to an output terminal in response to an optical control signal (or an electrical control signal). The input terminal and output terminal correspond to the n-channel injector terminal pair (or p-channel injector terminal pair) of the devices shown in FIGS. 2A and 2B. For optical control, the heterojunction thyristor device is biased such that the optical control signal is resonantly absorbed by the device and switches the device between the ON state/OFF state. For electrical control, the heterojunction thyristor device is biased such that the electrical control signal is injected into the QW channel(s) of the device and switches the device between the ON state/OFF state. In the ON state, the n-channel injector terminal pair (or p-channel injector terminal pair) are operably coupled together (with minimal potential voltage difference therebetween). In the OFF state, the n-channel injector terminal pair (or p-channel injector terminal pair) are electrically isolated from one another.

In addition, the heterojunction thyristor devices of the present invention can be configured to operate as various other optoelectronic components including a digital optical modulator and optical amplifier as described below.

A digital optical modulator operates in one of two distinct optical states in modulating an input optical signal. In optical state 1, there is substantially no loss to the input optical signal via absorption. In optical state 2, substantially all of the input optical signal is absorbed. To configure the heterojunction thyristor device as a digital optical modulator, an optical path is provided through the device either vertically or in the waveguide mode, and an input signal is applied to the injector terminal 38. When the input signal produces a forward bias between the injector terminal 38 and the anode terminal 36 sufficient to produce charge in the QW channel (s) of the device greater than the critical switching charge $Q_{CR}$, the heterojunction thyristor device operates in its conducting/ON state. The device is biased such that the current I through the device in the ON state is substantially below the threshold for lasing (preferably about 0.5 to 0.7 of the lasing threshold current). In this configuration, in the ON state, the device operates in optical state 1 whereby there is substantially no loss to the input optical signal via absorption. When the input signal produces a reverse bias between the injector terminal 38 and the anode terminal 36, charge is drawn from the injector terminal 38 such that the channel charge in the QW channel(s) of the device falls below the hold charge $Q_H$, and the heterojunction thyristor device operates in its non-conducting/OFF state. In the OFF state, the device operates in optical state 2 whereby substantially all of the input optical signal is absorbed. Preferably, the digital optical modulator includes a diffraction grating as described above. This grating enhances the absorption and enables modulation between the 0 and 1 states in the shortest possible length.

An optical amplifier amplifies an input optical signal to produce a corresponding output optical signal with an increased intensity level. To configure the heterojunction thyristor device as an optical amplifier, a forward bias is applied between the injector terminal 38 and cathode terminal 40, and a forward bias is applied between the anode terminal 36 and cathode terminal 40 through a load resistance $R_L$ that sets the current I in the ON state at a point substantially below lasing threshold $I_L$. In this configuration, in the ON state, the device amplifies an input optical signal to produce a corresponding output optical signal with an increased intensity level. The optical amplifier may be switched into and out of the ON state by applying forward and reverse biases to the injector terminal 38 with respect to the anode terminal 36 as described above. The gain of the optical amplifier in the ON state and thus the output signal intensity level may be changed by adjusting the current I in the ON state. Preferably, the optical amplifier operates without the existence of a diffraction grating in the structure. In this configuration, there will be no interaction between the waveguide traveling wave and the vertical cavity oscillation. The gain is obtained by using the high density of electrons and holes in the vertical laser above threshold.

The structures of FIGS. 1A and 1B may also be used to produce an in-plane passive waveguide. In such a configuration, the diffraction grating, the ohmic gate/emitter electrode layers, and any contacts to n+ and p+ regions are omitted in order to minimize waveguide loss. The waveguide ridge cross-section is formed by a combination of several mesas, which are formed by vertical/horizontal surfaces formed in the layers between the top DBR mirror and the bottom DBR mirror, to provide both laterally guiding and vertical guiding of light therein.

In addition, the multilayer structure of FIGS. 1A and 1B can be used to realize various other optoelectronic components including a PIN detector and analog optical modulator as described below.

A PIN detector generates an electrical signal proportional to the optical signal incident thereon. To configure the multilayer structure of FIGS. 1A and 1B as a PIN detector, the n-type ohmic contact layer (which is coupled to the cathode terminal 40 of the heterojunction thyristor device) floats electrically and a reverse bias is applied between the p-type ohmic contact layer 30 (which is coupled to the anode terminal 36 of the heterojunction thyristor device) and the n-channel injector terminal(s) (38A, 38B). Such a configuration creates a reverse-bias PIN junction that generates an electrical signal (photocurrent) proportional to the optical signal incident to the vertical cavity. Preferably, the PIN detector incorporates a diffraction grating for efficient operation.

An analog optical modulator modulates an input optical signal linearly over a range of modulation values. To configure the multilayer structure of FIGS. 1A and 1B as an analog optical modulator, the n-type ohmic contact layer (which is coupled to the cathode terminal 40 of the heterojunction thyristor device) floats electrically. Similar to the heterojunction thyristor device, an optical path is provided through the device either vertically or in the waveguide mode, and an input signal is applied to the anode terminal 36 with respect to the injector terminal(s) 38 such that the anode terminal 36 is biased positively with respect to the injector terminal(s) 38. In this configuration, the voltage at the anode terminal 36 is varied over a range of voltage levels where absorption of the device varies linearly. The top of the voltage range (where minimum absorption occurs) is defined by the operation point where conduction occurs from the anode terminal 36 to the injector terminal(s) 38. Preferably, the analog modulator incorporates a diffraction grating for efficient operation.

The structure of FIGS. 1A and 1B may also be used to realize various transistor devices, including n-channel HFET devices, p-channel HFET devices, n-type quantum-well-base bipolar transistors and p-type quantum-well-base bipolar transistors as described below in detail.

Figure 3A:
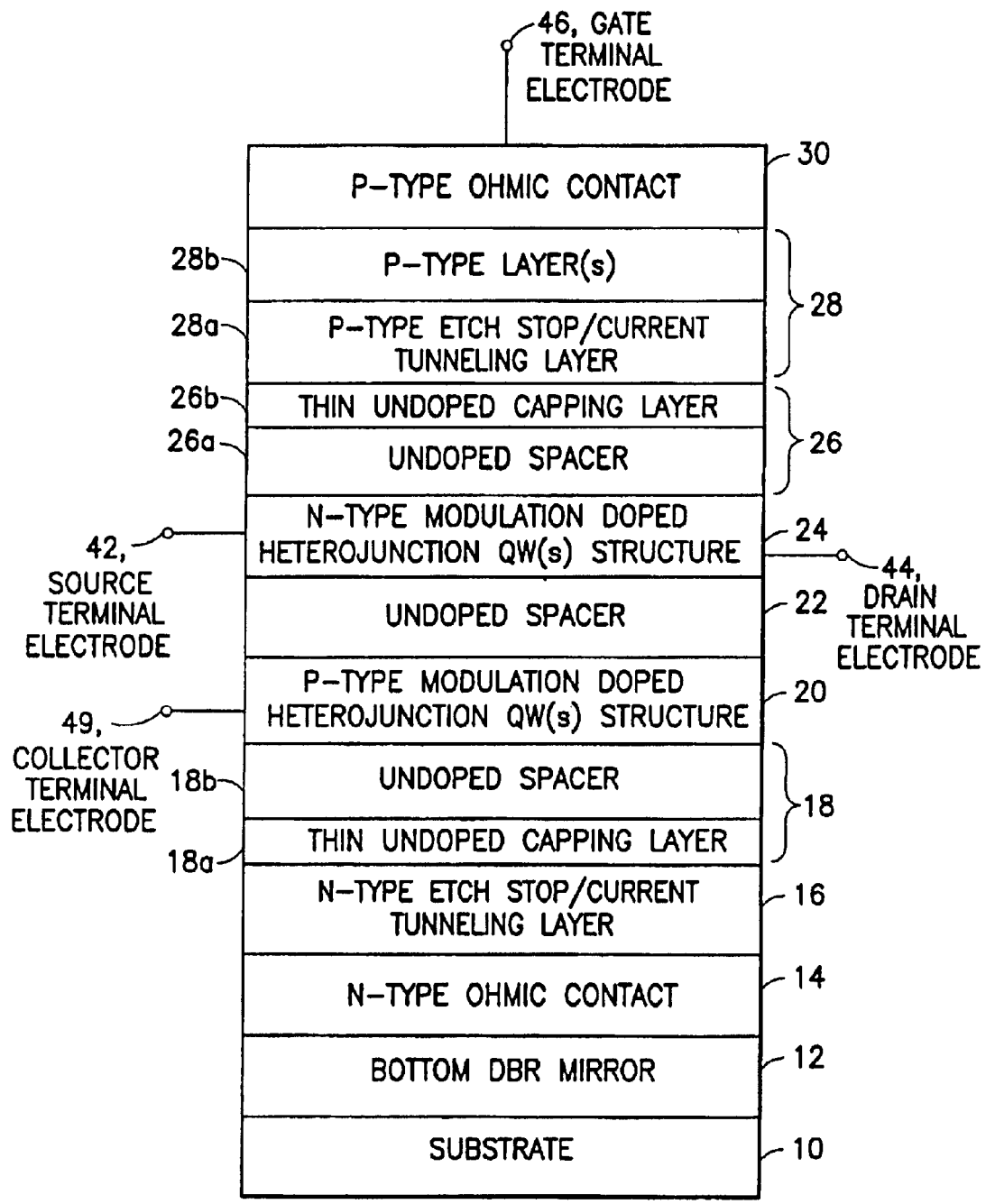
FIG. 3A is a cross-sectional schematic view showing the generalized construction of an exemplary n-channel field effect transistor (FET) device formed from the layer structure of FIG. 1A.

FIG. 3A illustrates an exemplary n-channel HFET device realized from the multilayer sandwich of FIG. 1A. As shown, a source terminal electrode 42 and a drain terminal electrode 44 are electrically coupled to the n-type QW structure 24 to form a channel region therebetween. A gate terminal electrode 46 is formed on the p-type ohmic contact layer 30 and covers the n-type QW inversion channel. Preferably, one or more collector terminal electrodes 48 are electrically coupled to the p-type QW structure 20 below the n-type QW inversion channel. When forming the n-channel HFET device via etching and metallization, etch stop layer 28a is used as an etch stop in order to form contacts that are electrically coupled to the n-type QW structure 24 (such contacts are subsequently metallized to form the source terminal electrode 42 and the drain terminal electrode 44). In this configuration, the collector terminal electrode 48 is preferably connected as a back gate similar to the substrate contact in a silicon-based MOSFET transistor.

Figure 3B:
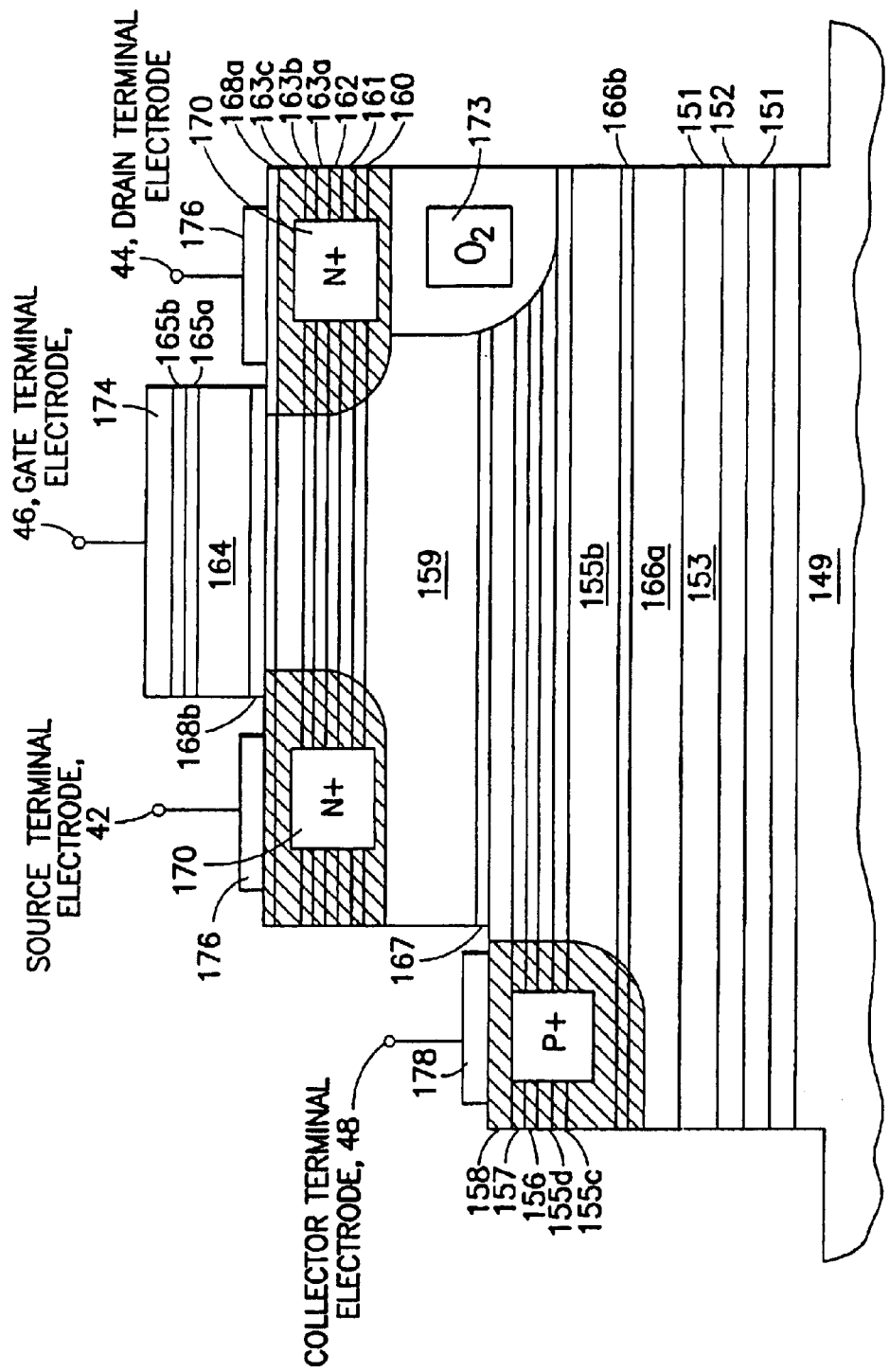
FIG. 3B is a cross-sectional schematic view showing the generalized construction of an exemplary n-channel field effect transistor (FET) device formed from the layer structure of FIG. 2A.

FIG. 3B illustrates an exemplary n-channel HFET device realized from the multilayer sandwich of FIGS. 1B and 1C. As shown, a metal layer 174 (preferably comprising tungsten) is deposited on the ohmic contact layer 165b to form the gate terminal electrode 46. The structure outside the gate terminal electrode 46 is etched down to the etch stop layer 168b. During this operation, a chlorine-based gas mixture that includes fluorine is used as an etchant to etch down to the etch-stop layer 168b. This etch stop layer 168b is then easily dissolved in de-ionized (DI) water or wet buffered hydrofluoric acid (BHF) to form mesas at the undoped GaAs layer 168a. The resulting mesas at the undoped GaAs layer 168a are then subject to N+ ion implants 170, which are electrically coupled to the n-type QW inversion channel(s). On the source terminal electrode side of the device, the resulting structure is etched preferably down to layer 158, and the resulting mesa at layer 158 is subject to an ion implant 171 of p-type ions, which contacts the p-type QW inversion channel(s). Also an insulating implant 173 (utilizing, for example, oxygen as shown) is performed under the n-type ion implant 170 for the drain terminal electrode side of the device to reduce the capacitance for high speed operation. An insulating implant (not shown) may also be performed under the p+-type implant 171 for this same purpose. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers (not shown) which form the top DBR mirror. During this oxidation step, the exposed sidewalls of the etched AlGaAs layers are passivated by the formation of very thin layers of oxide. The final step in the fabrication is the deposition (preferably via lift off) of metal contacts. These contacts come in two forms. One is the metal layer 176 (preferably comprising an n-type Au alloy metal such as AuGe/Ni/Au) deposited on the N+ type implants 170 to form the source terminal electrode 42 and drain terminal electrode 44 of the device. The other is the metal layer 178 (preferably comprising an p-type Au metal alloy such as AuZn/Cr/Au) deposited on the P+ type implant 171 to form the collector terminal electrode 48 of the device.

Figure 3C:
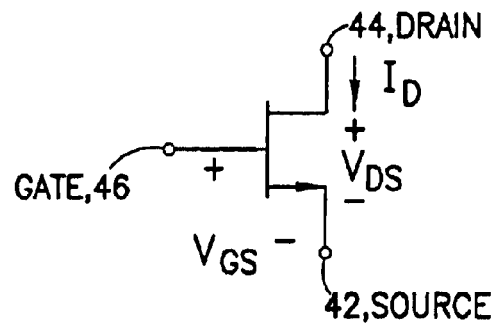
FIG. 3C is a pictorial illustration of an exemplary configuration of the n-channel FET devices of FIGS. 3A and 3B.
Figure 3D:
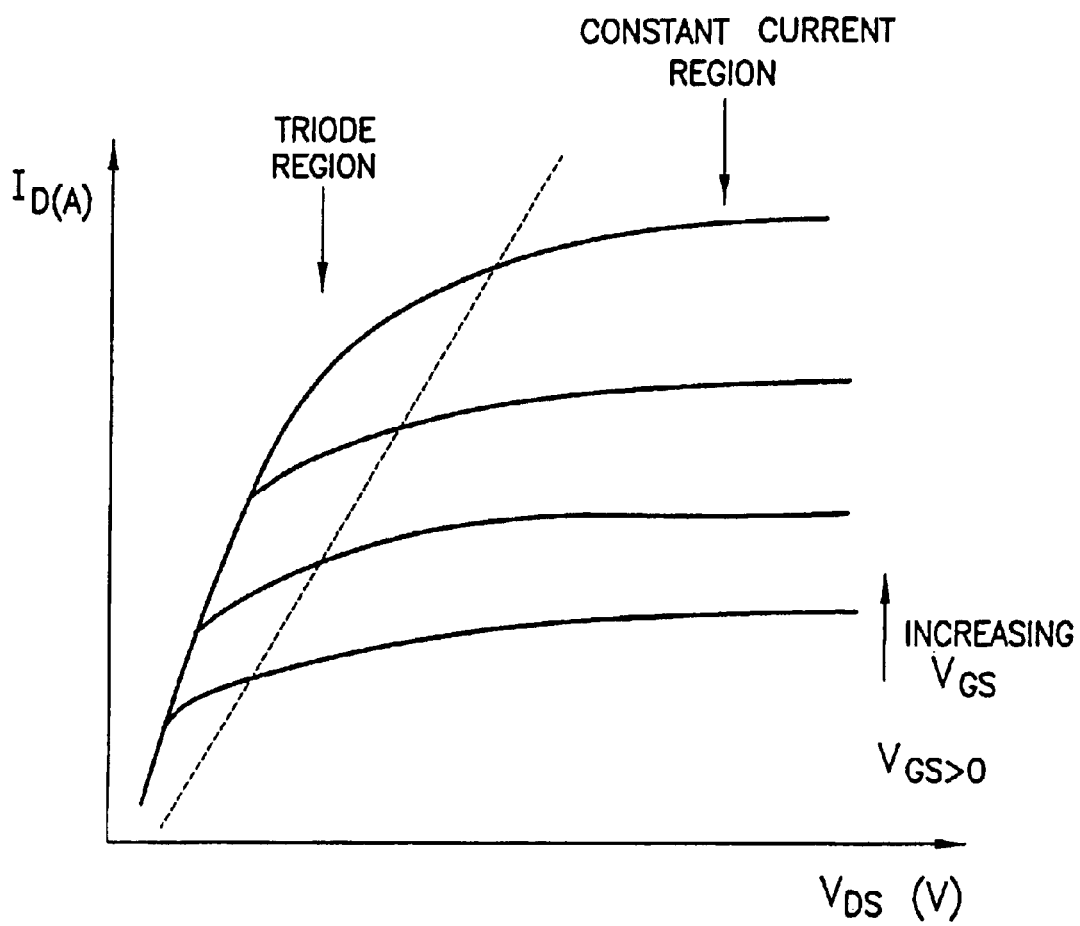
FIG. 3D is a graph showing the generalized current-voltage characteristics of the n-channel FET devices of FIGS. 3A and 3B.

FIGS. 3C and 3D illustrate the operational characteristics of the n-channel HFET devices of FIGS. 3A and 3B. The n-channel HFET device is an enhancement-mode device with a positive voltage level of $V_{GS}$ turning-on the device. Under normal operation, the drain terminal electrode 44 is forward biased with respect to the source terminal electrode 42 by a positive voltage level $V_{DS}$, and the gate terminal electrode 46 is forward biased with respect to the source terminal electrode 42 by a positive voltage level $V_{GS}$ as shown in FIGS. 3C and 3D. For small values of $V_{DS}$, the device operates in the triode region where the current $I_D$ varies in a quasi-linear manner with respect to $V_{DS}$ as shown in FIG. 3D. For larger values of $V_{DS}$, the device operates in the constant current region where the current $I_D$ is substantially constant with respect to $V_{DS}$ as shown in FIG. 3D. The collector terminal electrode 48 of the device (not shown) is preferably connected as a back gate similar to the substrate contact in a silicon-based MOSFET transistor, and provides for bias control of the region under the N-type QW inversion channel(s) of structure 24. More specifically, a negative bias on the collector terminal electrode 48 with respect to the source terminal electrode 42 causes an increase in the turn-on voltage of the n-channel HFET device. This bias voltage also increases the diode depletion region width, thereby decreasing the parasitic node capacitance.

Figure 4A:
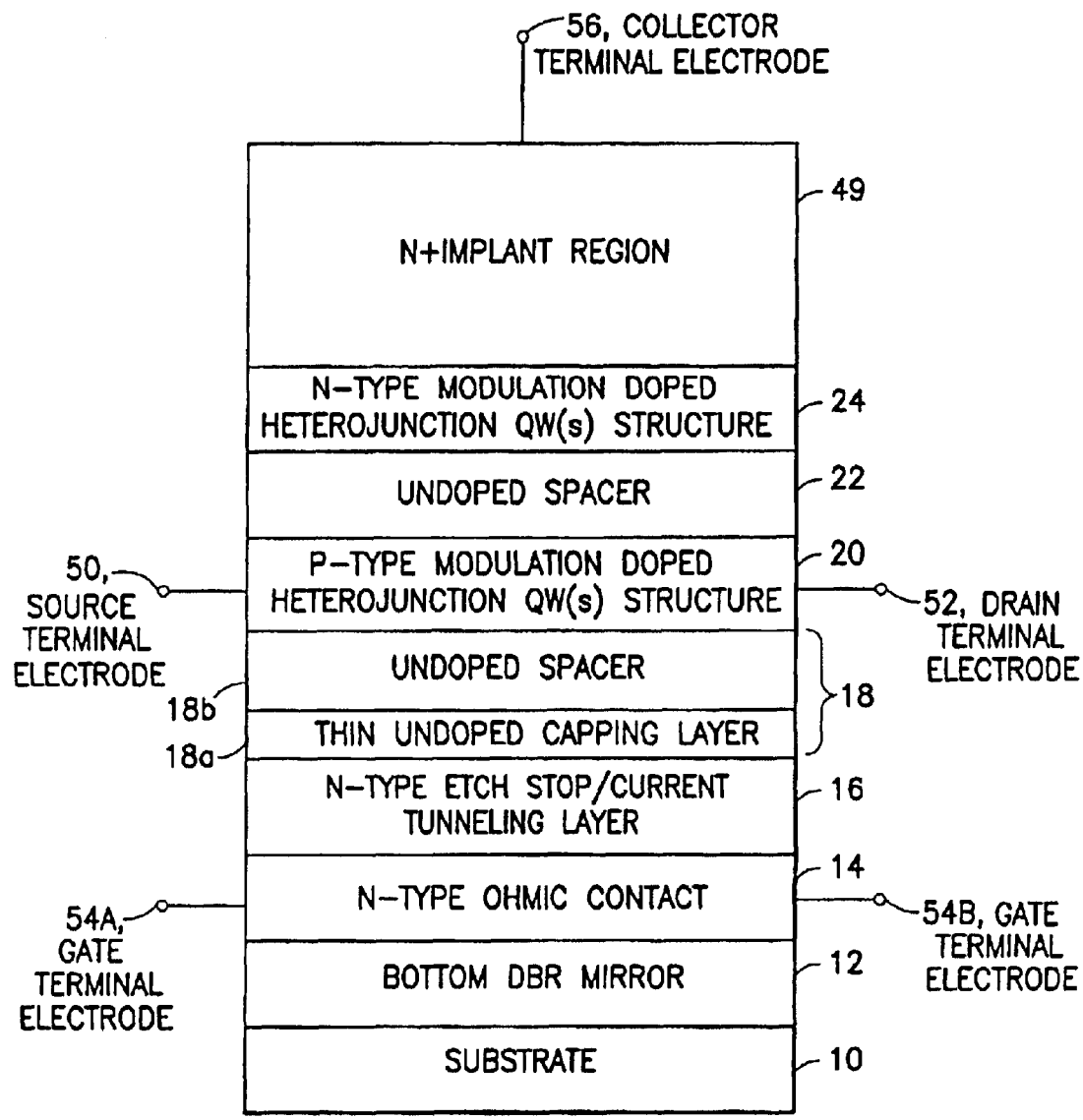
FIG. 4A is a cross-sectional schematic view showing the generalized construction of an exemplary p-channel field effect transistor (FET) device formed from the layer structure of FIG. 1A.

FIG. 4A illustrates an exemplary p-channel HFET device realized from the multilayer sandwich of FIG. 1A. As shown, a source terminal electrode 50 and a drain terminal electrode 52 are electrically coupled to the p-type QW structure 20 to form a channel region therebetween. One or more gate terminal electrodes (two shown as 54A, 54B) are electrically coupled to the ohmic contact layer 14 below the p-type QW inversion channel. Preferably, an N+ implant region 49 is formed at the top of the device and is electrically coupled to the n-type QW structure 24, and a collector terminal electrode 56 is formed on the N+ implant region 49 above the p-type QW inversion channel. When forming the p-channel HFET device via etching and metallization, etch stop layer 16 is used as an etch stop in order to form contacts that are electrically coupled to the ohmic contact layer 14 (such contacts are subsequently metallized to form the gate terminal electrodes 54A, 54B of the p-channel HFET device). In this configuration, the collector terminal electrode 56 is connected as a back gate similar to the substrate contact in a silicon-based MOSFET transistor.

Figure 4B:
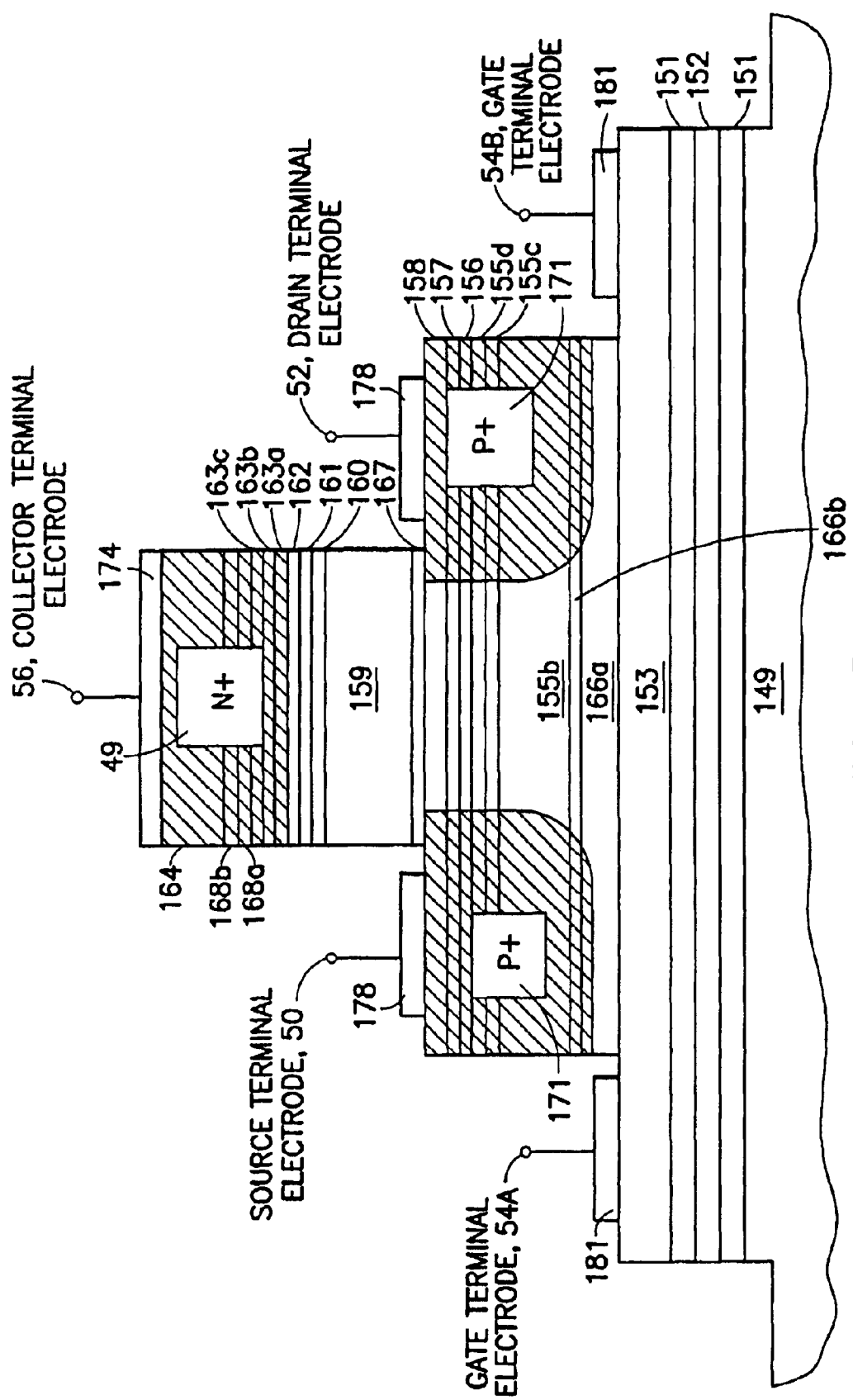
FIGS. 4B and 4C are cross-sectional schematic views showing the generalized construction of exemplary p-channel field effect transistor (FET) devices formed from the layer structure of FIG. 2A.

FIG. 4B illustrates an exemplary p-channel HFET device realized from the multilayer sandwich of FIGS. 1B and 1C. As shown, ohmic contact layers 165a and 165b are removed via etching, and an N+ ion implant 49 is formed (preferably to a depth of layer 162 as shown) that is electrically coupled to the n-type QW inversion channel(s). A metal layer 174 (preferably comprising tungsten) is deposited on the N+ ion implant 49 to form the collector terminal electrode 56 of the device. The structure outside the collector terminal electrode 56 is etched preferably down to layer 158, and the resulting mesas at layer 158 are then subject to an ion implant 171 of p-type ions, which contacts the p-type QW inversion channel(s). Connection to the gate terminal (N+ layer 153) of the device is made by etching with a chlorine-based gas mixture that includes fluorine. This etch is performed down to the AlAs etch stop layer 166a. This layer 166a is then easily dissolved in de-ionized (DI) water or wet buffered hydrofluoric acid (BHF) to form resulting mesas in the N+ layer 153. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers (not shown) which form the top DBR mirror. During this oxidation step, the exposed sidewalls of the etched AlGaAs layers are passivated by the formation of very thin layers of oxide. The final step in the fabrication is the deposition (preferably via lift off) of metal contacts. These contacts come in two forms. One is the metal layer 178 (preferably comprising an p-type Au metal alloy such as AuZn/Cr/Au) deposited on the P+ type implant 171 to form the source terminal electrode 50 and the drain terminal electrode 52 of the device. The other is metal layer 181 (preferably comprising an n-type Au alloy metal such as AuGe/Ni/Au) deposited on the mesas at the N+ layer 153 to formed the gate terminal electrodes 54A, 54B of the device.

Figure 4C:
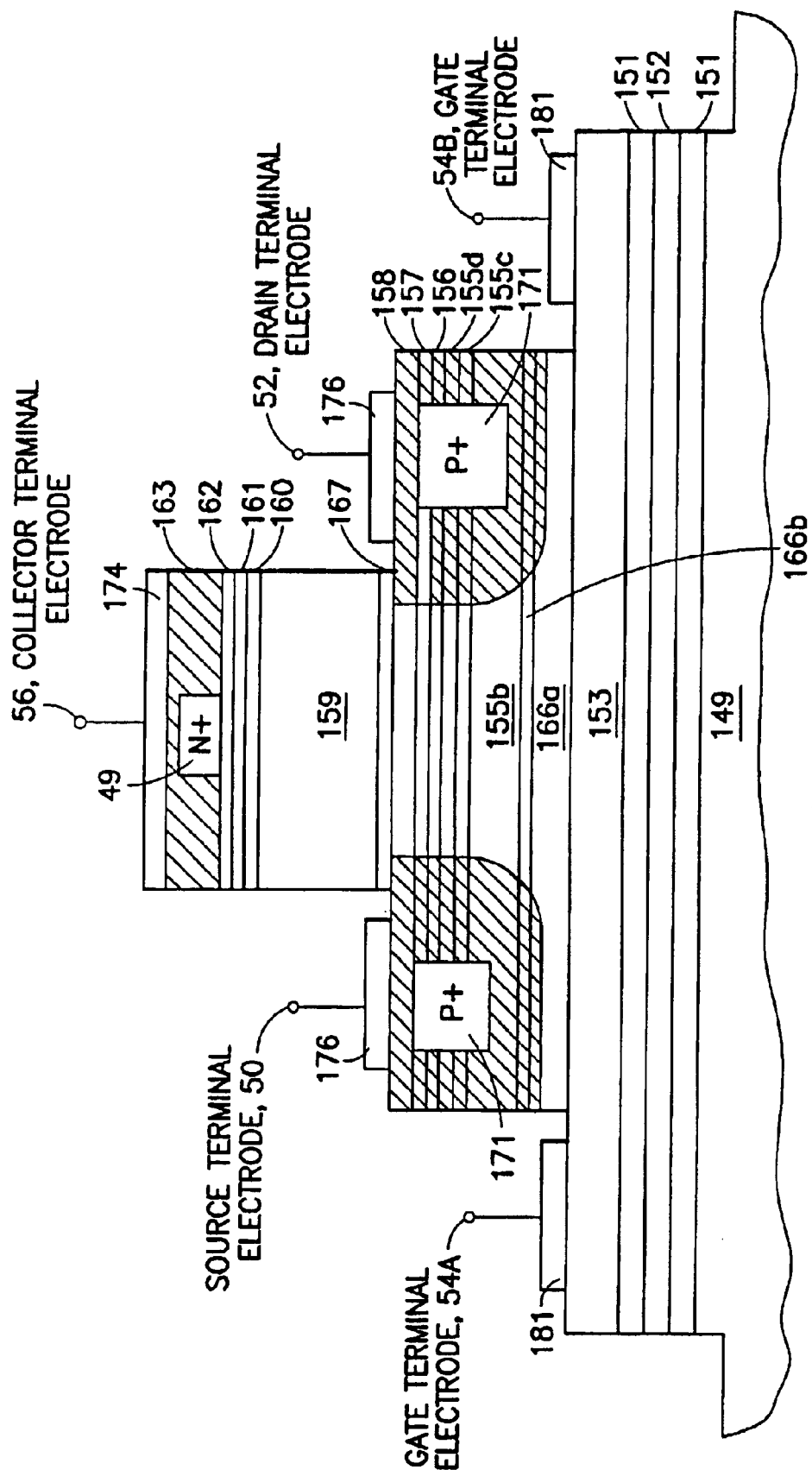

FIG. 4C illustrates another exemplary p-channel HFET device realized from the multilayer sandwich of FIGS. 1B and 1C. This device is fabricated in same manner as described above with respect to FIG. 4B, except that layer 164 (in addition to ohmic contact layers 165a and 165b) is removed via etching before performing the N+ ion implant 49 into layers 163c, 163b, 163a (collectively 163 as shown).

Figure 4D:
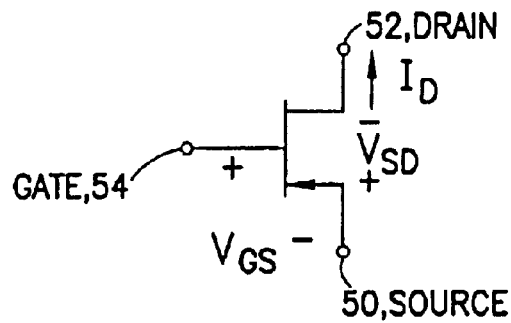
FIG. 4D is a pictorial illustration of an exemplary configuration of the p-channel FET devices of FIGS. 4A, 4B and 4C.
Figure 4E:
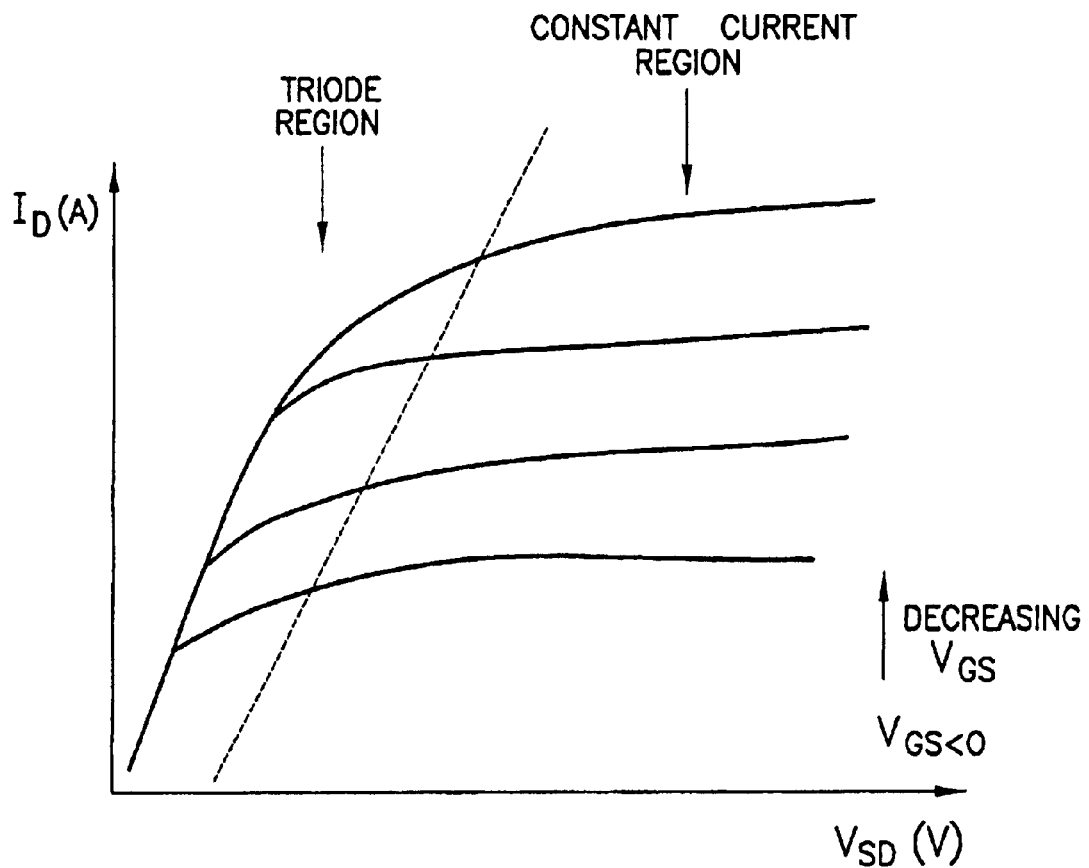
FIG. 4E is a graph showing the generalized current-voltage characteristics of the p-channel FET devices of FIGS. 4A, 4B and 4C.

FIGS. 4D and 4E illustrate the operational characteristics of the p-channel HFET devices of FIGS. 4A, 4B and 4C. The p-channel HFET device is an enhancement-mode device with a negative voltage level of $V_{GS}$ turning-on the device. Under normal operation, the source terminal electrode 50 is forward biased with respect to the drain terminal electrode 52 by a positive voltage level $V_{SD}$, and the gate terminal electrode 54 is reverse biased with respect to the source terminal electrode 50 by a negative voltage level $V_{GS}$ as shown in FIGS. 4D and 4E. For small values of $V_{SD}$, the device operates in the triode region where the current $I_D$ varies in a quasi-linear manner with respect to $V_{SD}$ as shown in FIG. 4E. For larger values of $V_{SD}$, the device operates in the constant current region where the current $I_D$ is substantially constant with respect to $V_{SD}$ as shown in FIG. 4E. The collector terminal electrode 56 of the device (not shown) is preferably connected as a back gate similar to the substrate contact in a silicon-based MOSFET transistor, and provides for bias control of the region above the p-type QW inversion channel(s) of structure 20. More specifically, a positive bias on the collector terminal electrode 56 with respect to the source terminal electrode 50 causes a decrease in the turn-on voltage of the p-channel HFET device. This bias voltage also increases the diode depletion region width, thereby decreasing the parasitic node capacitance.

Figure 5A:
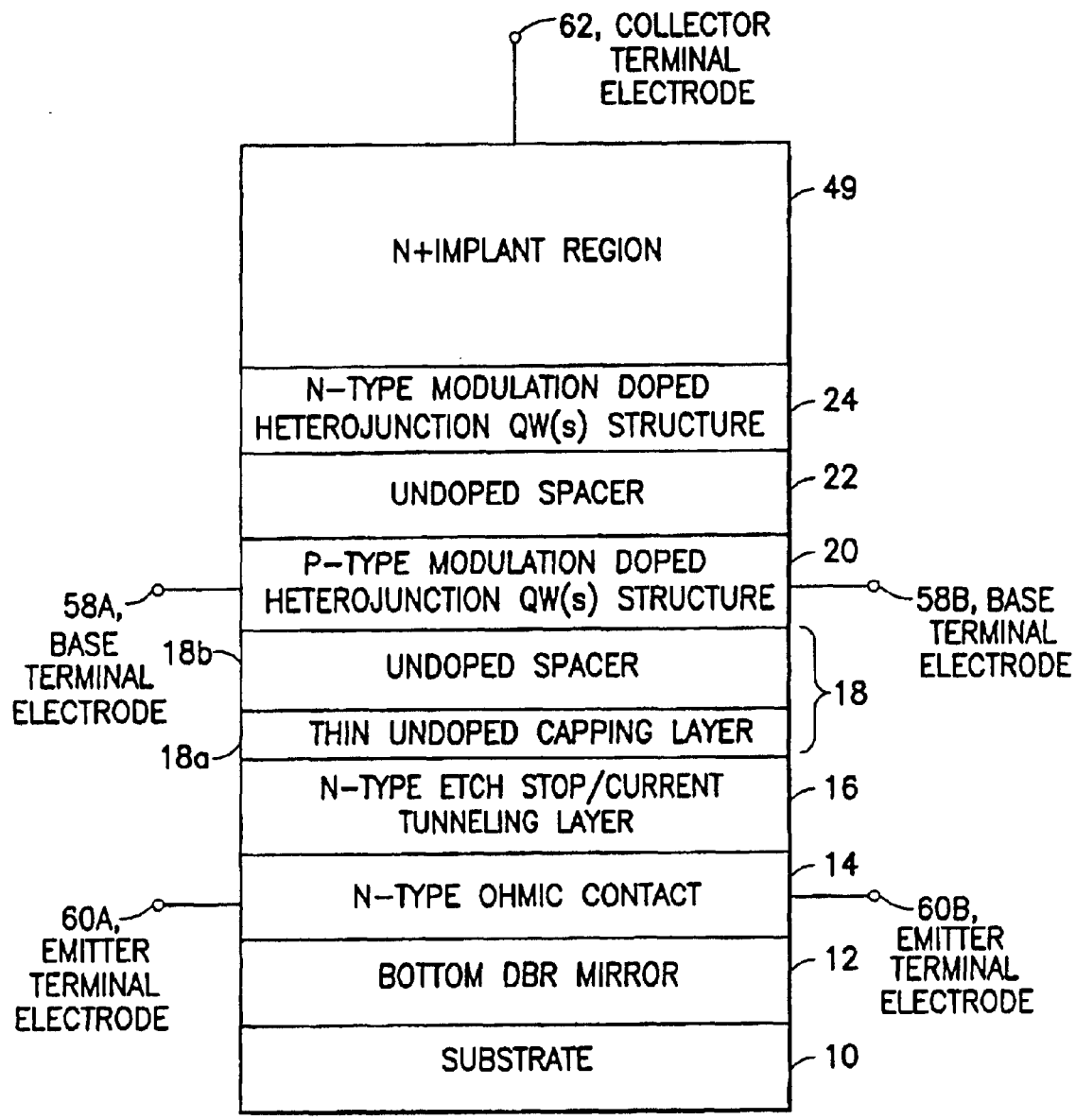
FIG. 5A is a cross-sectional schematic view showing the generalized construction of an exemplary p-type quantum-well-base bipolar transistor device formed from the layer structure of FIG. 1A.

FIG. 5A illustrates an exemplary p-type quantum-well-base bipolar transistor device realized from the multilayer sandwich of FIG. 1A. As shown, at least one base terminal electrode (two shown as 58A, 58B) are electrically coupled to the p-type QW structure 20. One or more emitter terminal electrodes (two shown as 60A, 60B) are electrically coupled to the ohmic contact layer 14 below the p-type QW structure 20. Preferably, an N+ implant region 49 is formed at the top of the device and is electrically coupled to the n-type QW structure 24, and a collector terminal electrode 62 is formed on the N+ implant region 49 above the p-type QW structure 20. When forming the p-type quantum-well-base bipolar transistor device via etching and metallization, etch stop layer 16 is used as an etch stop in order to form contacts that are electrically coupled to the ohmic contact layer 14 (such contacts are subsequently metallized to form the emitter terminal electrodes 60A, 60B of the p-type quantum-well-base bipolar transistor device).

Figure 5B:
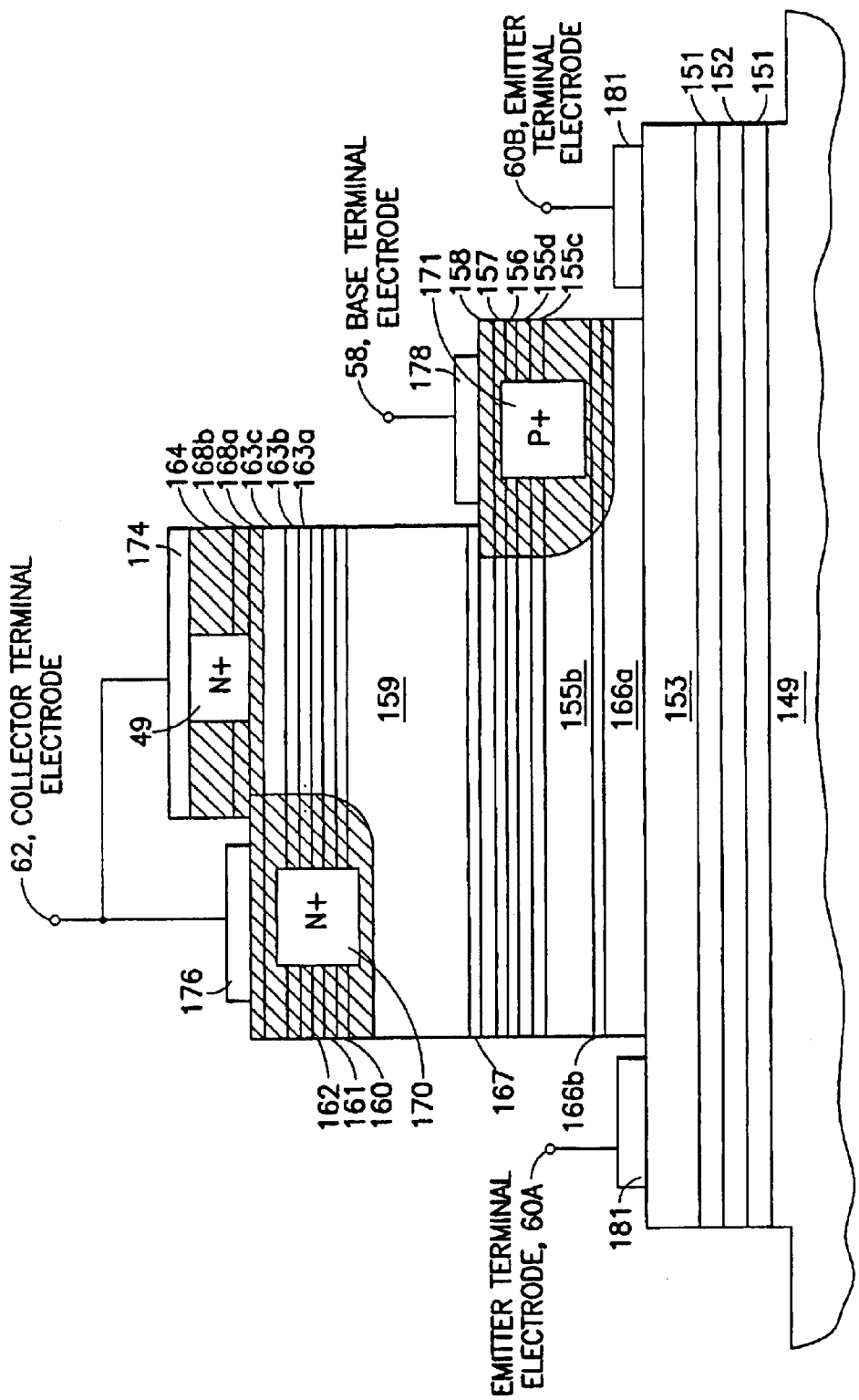

FIG. 5B illustrates an exemplary p-type quantum-well-base bipolar transistor device realized from the multilayer sandwich of FIGS. 1B and 1C. As shown, ohmic contact layers 165a and 165b are removed via etching, and an N+ ion implant 49 is formed (preferably to a depth of layer 163c as shown) that is electrically coupled to the n-type QW structure 24. A metal layer 174 (preferably comprising tungsten) is deposited on the N+ ion implant 49 to form a first part of the collector terminal electrode 62 of the device. On one side of the device, the structure outside the first part of the collector terminal electrode 62 is etched down to the etch stop layer 168b to form a mesa at layer 163c. During this operation, a chlorine-based gas mixture that includes fluorine is used as an etchant to etch down to the etch-stop layer 168b. This etch stop layer 168b is then easily dissolved in de-ionized (DI) water or wet buffered hydrofluoric acid (BHF) to form mesas at the undoped GaAs layer 168a. The resulting mesa at the undoped GaAs layer 168a is then subject to N+ ion implant 170, which is electrically coupled to the n-type QW structure 24. On the other side of the device, the resulting structure is etched preferably down to layer 158 to form a mesa at layer 158, and the resulting mesa at layer 158 is subject to an ion implant 171 of p-type ions, which contacts the p-type QW structure 20. Connection to the emitter terminal (N+ layer 153) of the device is made by etching with a chlorine-based gas mixture that includes fluorine. This etch is performed down to the AlAs etch stop layer 166a. This layer 166a is then easily dissolved in de-ionized (DI) water or wet buffered hydrofluoric acid (BHF) to form resulting mesas in the N+ layer 153. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers (not shown) which form the top DBR mirror. During this oxidation step, the exposed sidewalls of the etched AlGaAs layers are passivated by the formation of very thin layers of oxide. The final step in the fabrication is the deposition (preferably via lift off) of metal contacts. These contacts come in three forms. One is the metal layer 176 (preferably comprising an n-type Au alloy metal such as AuGe/Ni/Au) deposited on the N+ type implant 170 to form the second part of the collector terminal electrode 62 of the device (which is electrically connected to the first part by additional metal layers that are not shown). The second is the metal layer 178 (preferably comprising an p-type Au metal alloy such as AuZn/Cr/Au) deposited on the P+ type implant 171 to form the base terminal electrode 58 of the device. The third is metal layer 181 (preferably comprising an n-type Au alloy metal such as AuGe/Ni/Au) deposited on the mesas at the N+ layer 153 to form the emitter terminal electrodes 60A, 60B of the device.

FIG. 5C illustrates another exemplary p-type quantum-well-base bipolar transistor realized from the multilayer sandwich of FIGS. 1B and 1C. This device is fabricated in same manner as described above with respect to FIG. 5B, except that layer 164 (in addition to ohmic contact layers 165a and 165b) is removed via etching before performing the N+ ion implant 49 into layers 163c, 163b, 163a (collectively 163 as shown). In addition, the steps in forming the N+ ion implant 170 (and the second part of the collector terminal electrode 62 thereon) are omitted. Moreover, base terminal electrodes 58A, 58B are formed on both sides of the p-type QW structure 20 as shown.

Figure 5D:
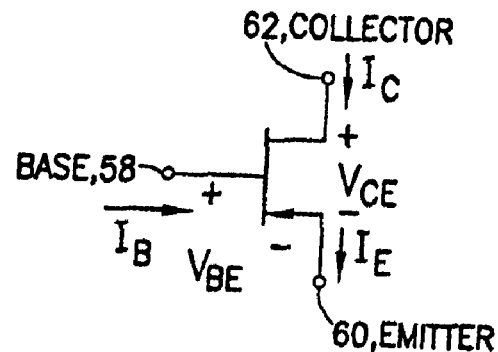
FIG. 5D is a pictorial illustration of an exemplary configuration of the p-type quantum-well-base bipolar transistor devices of FIGS. 5A, 5B and 5C.
Figure 5E:
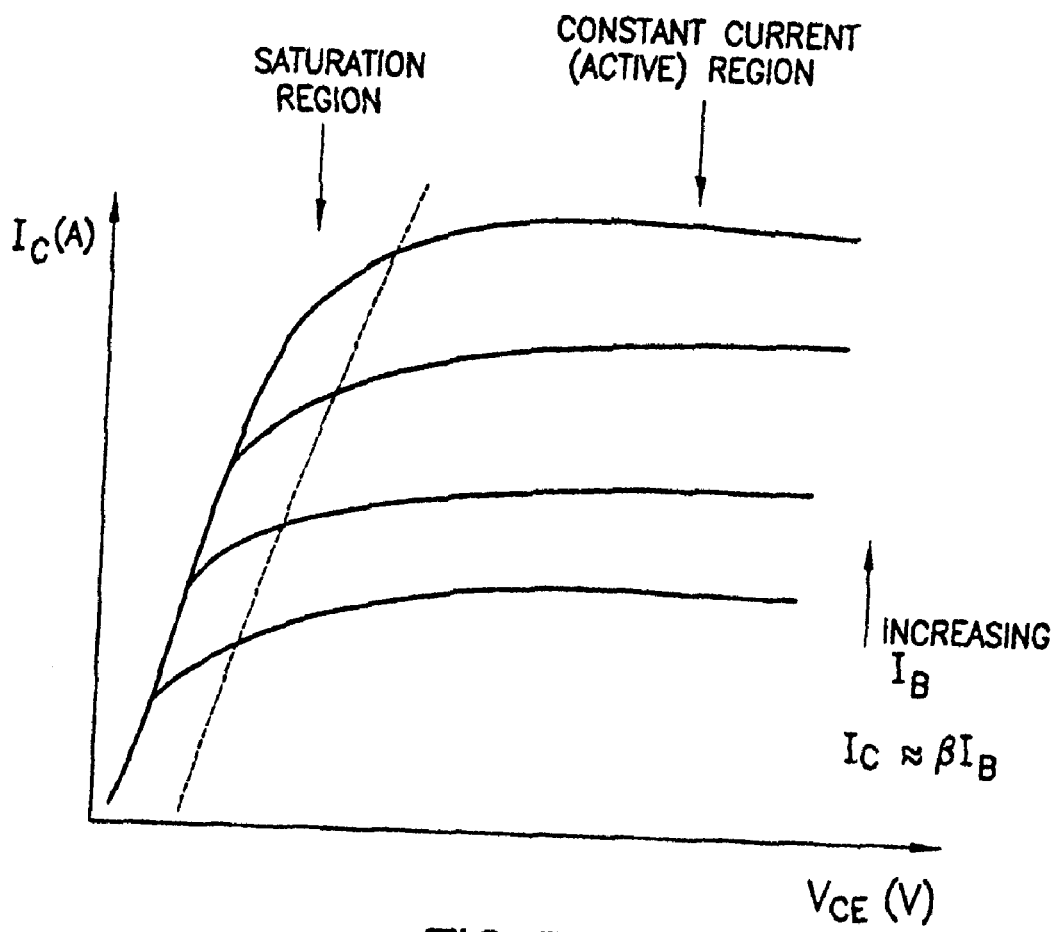
FIG. 5E is a graph showing the generalized current-voltage characteristics of the p-type quantum-well-base bipolar transistor devices of FIGS. 5A, 5B and 5C.

FIGS. 5D and 5E illustrate the operational characteristics of the p-type quantum-well-base bipolar transistor devices of FIGS. 5A, 5B and 5C. Under normal operation, the base terminal electrode 58 is forward biased with respect to the emitter terminal electrode 60 by a voltage level $V_{BE}$, and the collector terminal electrode 62 is forward biased with respect to the emitter terminal electrode 60 by a voltage level $V_{CE}$ as shown in FIG. 5D. For small values of $V_{CE}$, the device operates in the saturation region where the current $I_C$ varies in a quasi-linear manner with respect to $V_{CE}$ as shown in FIG. 5E. For larger values of $V_{CE}$, the device operates in the constant current region where the current $I_C$ is substantially constant with respect to $V_{CE}$ as shown in FIG. 5E.

Figure 6A:
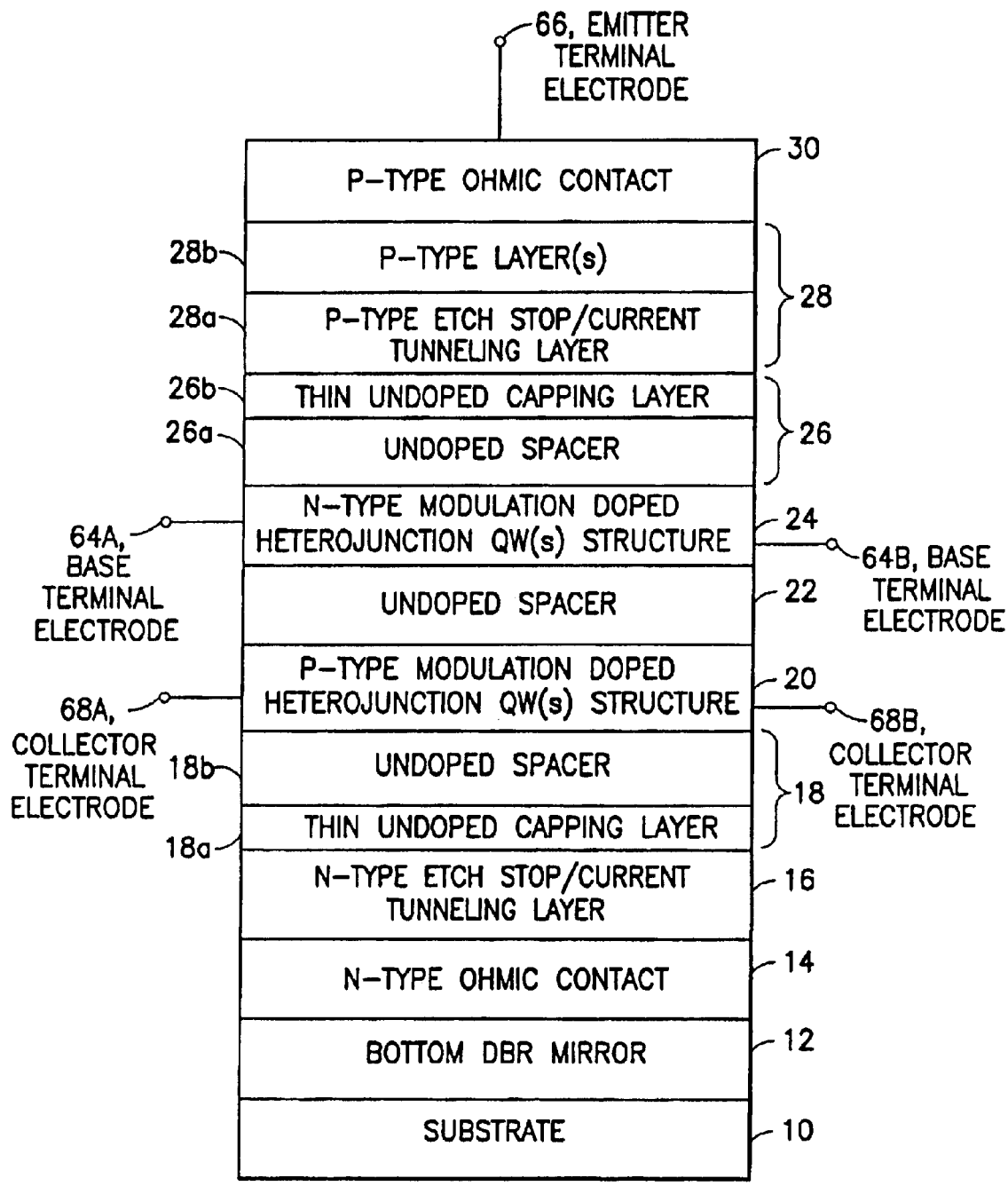
FIG. 6A is a cross-sectional schematic view showing the generalized construction of an exemplary n-type quantum-well-base bipolar transistor device formed from the layer structure of FIG. IA.

FIG. 6A illustrates an exemplary n-type quantum-well-base bipolar transistor device realized from the multilayer sandwich of FIG. 1A. As shown, at least one base terminal electrode (two shown as 64A, 64B) are electrically coupled to the n-type QW structure 24. One or more collector terminal electrodes (two shown as 68A, 68B) are electrically coupled to the p-type QW structure 20. An emitter terminal electrode 66 is formed on the ohmic contact layer 30. When forming the n-type quantum-well-base bipolar transistor device via etching and metallization, etch stop layer 28a is used as an etch stop in order to form contacts that are electrically coupled to the n-type QW structure 24 (such contacts are subsequently metallized to form the base terminal electrodes 64A, 64B).

Figure 6B:
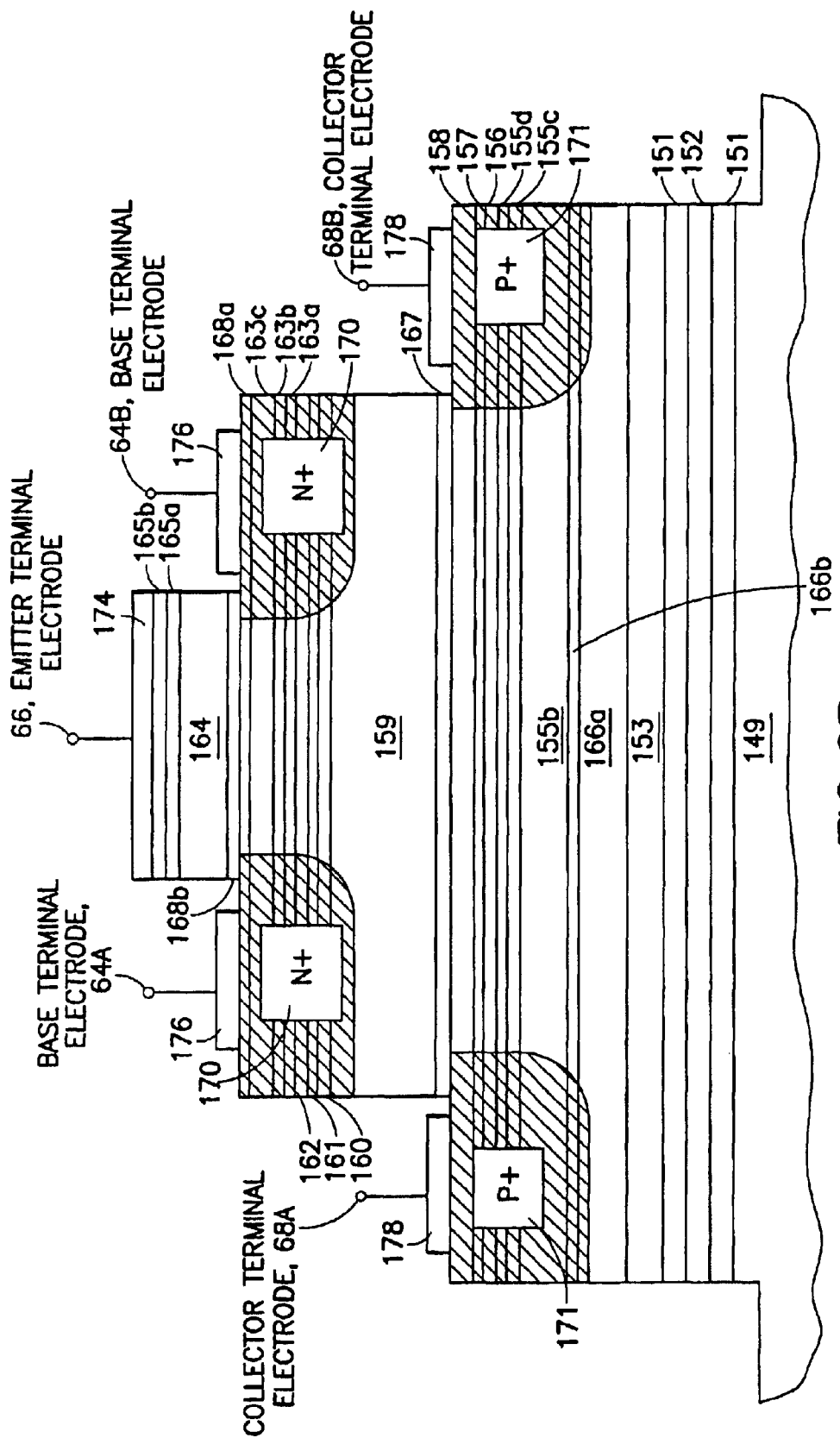
FIG. 6B is a cross-sectional schematic view showing the generalized construction of an exemplary n-type quantum-well-base bipolar transistor devices formed from the layer structure of FIG. 2A.

FIG. 6B illustrates an exemplary n-type quantum-well-base bipolar transistor realized from the multilayer sandwich of FIGS. 1B and 1C. As shown, a metal layer 174 (preferably comprising tungsten) deposited on the ohmic contact layer 165b forms the emitter terminal electrode 66 of the device. The structure outside the emitter terminal electrode 66 is etched down to the etch stop layer 168b. During this operation, a chlorine-based gas mixture that includes fluorine is used as an etchant to etch down to the etch-stop layer 168b. This etch stop layer 168b is then easily dissolved in de-ionized (DI) water or wet buffered hydrofluoric acid (BHF) to form mesas at the undoped GaAs layer 168a. The resulting mesas at the undoped GaAs layer 168a are then subject to N+ ion implants 170, which are electrically coupled to the n-type QW structure 24. The resulting structure is etched preferably down to layer 158, and the resulting mesas at layer 158 are then subject to an ion implant 171 of p-type ions, which contacts the p-type QW structure 20. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers (not shown) which form the top DBR mirror. During this oxidation step, the exposed sidewalls of the etched AlGaAs layers are passivated by the formation of very thin layers of oxide. The final step in the fabrication is the deposition (preferably via lift off) of metal contacts. These contacts come in two forms. One is the metal layer 176 (preferably comprising an n-type Au alloy metal such as AuGe/Ni/Au) deposited on the N+ type implants 170 to form the base terminal electrodes 64A, 64B of the device. The other is the metal layer 178 (preferably comprising an p-type Au metal alloy such as AuZn/Cr/Au) deposited on the P+ type implants 171 to form the collector terminal electrodes 68A, 68B of the device.

Figure 6C:
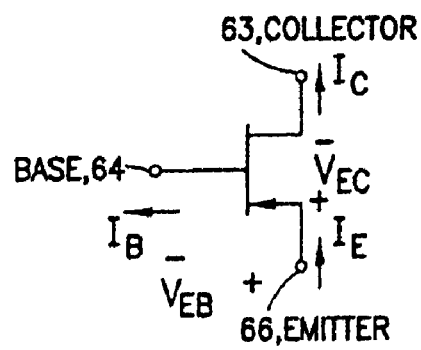
FIG. 6C is a pictorial illustration of an exemplary configuration of the n-type quantum-well-base bipolar transistor devices of FIGS. 6A and 6B.
Figure 6D:
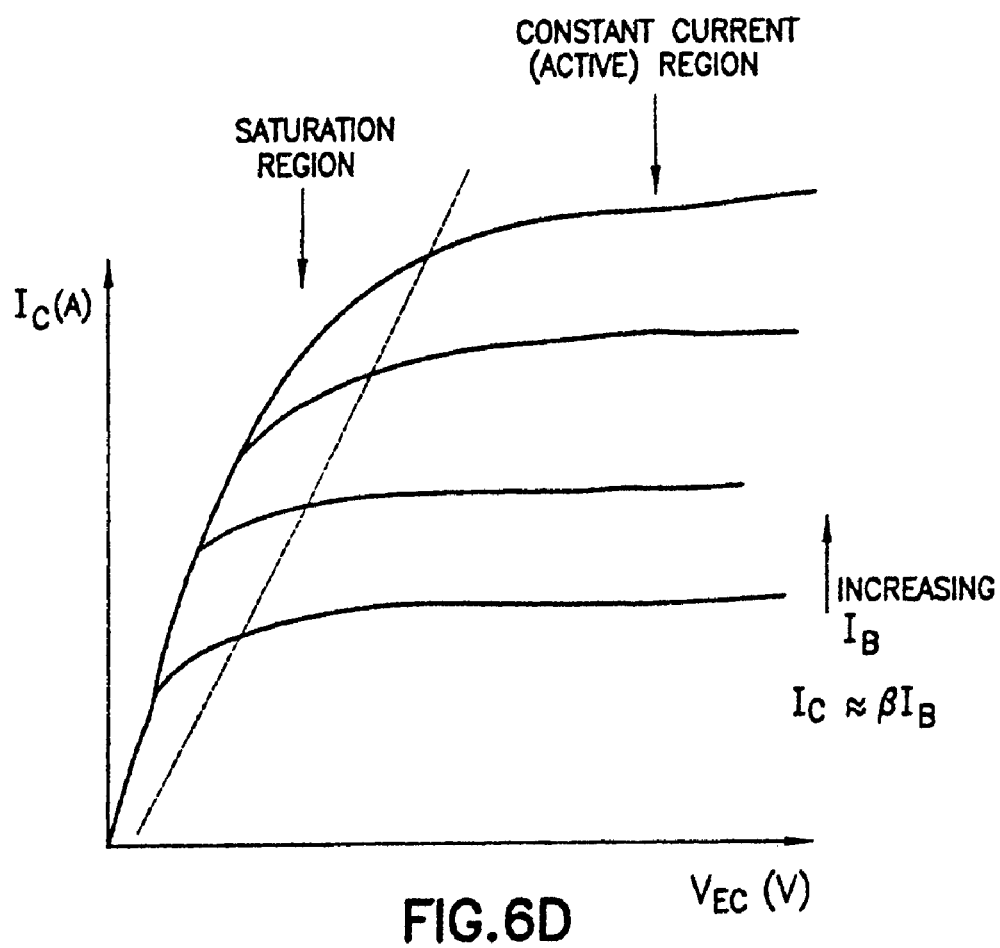
FIG. 6D is a graph showing the generalized current-voltage characteristics of the n-type quantum-well-base bipolar transistor devices of FIGS. 6A and 6B.

FIGS. 6C and 6D illustrate the operational characteristics of the n-type quantum-well-base bipolar transistor devices of FIGS. 6A and 6B. Under normal operation, the base terminal electrode 64 is reverse biased with respect to the emitter terminal electrode 66 by a voltage level $V_{EB}$, and the collector terminal electrode 68 is reverse biased with respect to the emitter terminal electrode 66 by a voltage level $V_{EC}$ as shown in FIG. 6C. For small values of $V_{EC}$, the device operates in the saturation region where the current $I_C$ varies in a quasi-linear manner with respect to $V_{EC}$ as shown in FIG. 6D. For larger values of $V_{EC}$, the device operates in the constant current region where the current $I_C$ is substantially constant with respect to $V_{EC}$ as shown in FIG. 6D.

Figure 7:
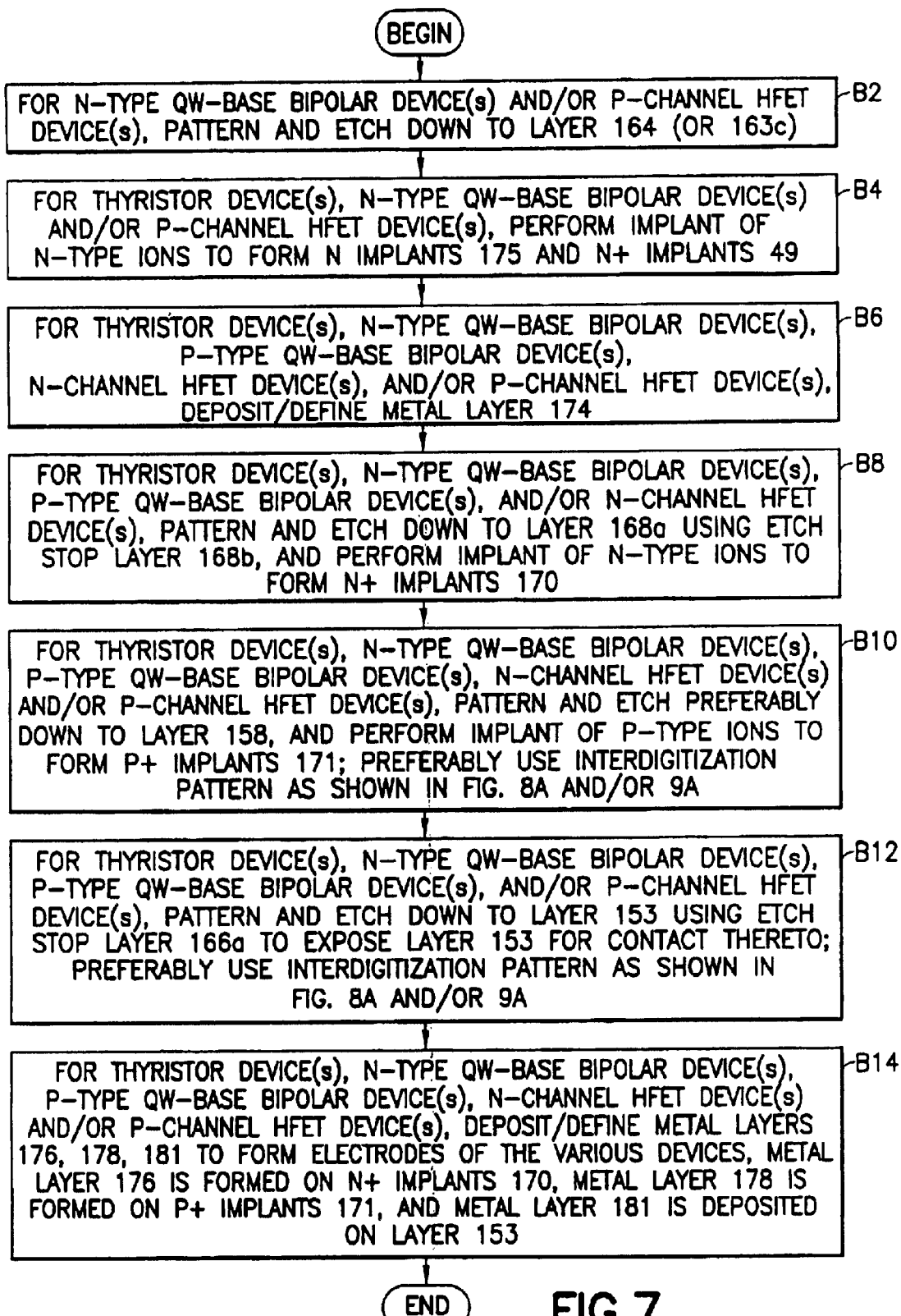
FIG. 7 is a flow chart illustrating an exemplary method of fabricating the multilayer structure of FIG. 1A to integrate the various optoelectronic/electronic devices described herein on a common substrate.

FIG. 7 is a flow chart illustrating an exemplary method of fabricating the multilayer structure of FIG. 1A to integrate the various optoelectronic/electronic devices described herein (including the heterojunction thyristor device of FIG. 2B, the n-channel HFET device of FIG. 3B, the p-channel HFET devices of FIGS. 4B and 4C, the p-type quantum-well-base bipolar transistor devices of FIGS. 5B and 5C, and the n-type quantum-well-base bipolar transistor device of FIG. 6B) on a common substrate. The methodology begins in block B2 by patterning and etching the structure over the active region of the each n-type quantum-well-base bipolar device and each p-channel HFET device. The etching operation of block B2 is controlled such that it terminates at layer 164 (or alternatively, at layer 163c).

Then, in block B4, an implant of n-type ions is performed to form the N-type implants 175 (of each heterojunction thyristor device) in addition to the N+-type implant 49 (of each n-type quantum-well-base bipolar device and each p-channel HFET device). Preferably, the N-type implants 175 are implanted into the p-type ohmic contact layers 165b/165a to a depth near layer 162 as shown in FIG. 2B, and the N+-type implant 49 is implanted into the layer 164 (or layer 163c) that is exposed by the etching operation of step B2 to a depth of layer 162 as shown in FIGS. 4B, 4C and 5C.

In block B6, a metal layer 174 (preferably comprising tungsten) is deposited and defined to form electrodes for the various devices. As part of block B6, metal layer 174 is deposited on the ohmic contact layer 165b above the N-type implants 175 to form the anode terminal electrodes 36A, 36B for each heterojunction thyristor device as shown in FIG. 2B. The metal layer 174 is also deposited above the N+-type implant 49 to form the collector electrode 56 of each p-channel HFET device (as shown in FIGS. 4B and 4C) and the collector electrode 62 for each n-type quantum-well-base bipolar transistor device (as shown in FIGS. 5B and 5C). In addition, the metal layer 174 is deposited on the ohmic contact layer 165b to form the gate terminal electrode 46 of each n-channel HFET device (as shown in FIG. 3B) and the emitter terminal electrode 66 for each n-type quantum-well-base bipolar transistor device (as shown in FIG. 6B).

In block B8, the resultant structure of block B6 is subject to a patterning and etching operation that exposes regions of layer 168a. During this operation, a chlorine-based gas mixture that includes fluorine is used as an etchant to etch down to the etch-stop layer 168b as described above. An implant of n-type ions is implanted into the exposed regions of layer 168a to form N+-type implants 170, which is used to contact to the n-type QW structure 24 for each heterojunction thyristor device (as shown in FIG. 2B), for each n-channel HFET device (as shown in FIG. 3B), for each n-type quantum-well-base bipolar transistor device (as shown in FIG. 6B), and possibly for each p-type quantum-well-base bipolar transistor device (as shown in FIG. 5B). Advantageously, the N+-type implants 170 are self-aligned by the electrodes formed on the mesas above the implants 170 as shown in these Figures.

In block B10, the resultant structure of block B8 is subject to an etching operation that exposes regions preferably at or near layer 158. An implant of p-type ions is implanted into the exposed regions to form the P+-type implants 171, which are used to contact the p-type QW structure 20 for each heterojunction thyristor device (as shown in FIG. 2B), for each n-channel HFET device (as shown in FIG. 3B), for each p-channel HFET device (as shown in FIGS. 4B and 4C), for each p-type quantum-well-base bipolar transistor device (as shown in FIGS. 5B and 5C), and for each n-type quantum-well-base bipolar transistor device (as shown in FIG. 6B). Advantageously, the P+-type implants 171 are self-aligned by the N+-type implants 170 formed on the mesas above the implants 171.

In block B12, the resultant structure of block B10 is subject to a patterning and etching operation that exposes regions of ohmic contact layer 153. During this operation, a chlorine-based gas mixture that includes fluorine is used as an etchant to etch down to the etch-stop layer 166a as described above. The exposed regions of layer 153 are used to form a low resistance contact to electrodes for the various devices, including the cathode terminal electrodes 40A, 40B of each heterojunction thyristor device (as shown in FIG. 2B), the gate terminal electrodes 54A, 54B for each p-channel HFET device (as shown in FIGS. 4B and 4C), and the emitter terminal electrodes 60A, 60B for each p-type quantum-well-base bipolar transistor device (as shown in FIGS. 5B and 5C). In addition, the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to convert layers 151 to AlO, which form the bottom DBR mirror. During this oxidation step, the exposed sidewalls of the etched AlGaAs layers are passivated by the formation of very thin layers of oxide. In addition, the layers 179/180 are deposited to form the top DBR mirror. Preferably, the layers 179/80 comprise $SiO_2$ and a high refractive index material such as GaAs, Si, or GaN.

Finally, in block B14, metal layers 176, 178 and 181 are deposited and defined (preferably via lift off). Metal layer 176 (which preferably comprises an n-type Au alloy metal such as AuGe/Ni/Au) is deposited on the N+ type implants 170 to form the N-channel injector terminal electrodes 38A, 38B of each heterojunction thyristor device (as shown in FIG. 2B), the source terminal electrode 42 and drain terminal electrode 44 of each n-channel HFET device (as shown in FIG. 3B), the base terminal electrodes 64A, 64B of each n-type quantum-well-base bipolar transistor device (as shown in FIG. 6B), and possibly a portion of the collector terminal electrode 62 of each p-type quantum-well-base bipolar transistor device (as shown in FIG. 5B). Metal layer 178 (which preferably comprises a p-type Au metal alloy such as AuZn/Cr/Au) is deposited on the P+ type implants 171 to form the p-channel injector terminal electrodes 38C, 38D of each heterojunction thyristor device (as shown in FIG. 2B), the source terminal electrode 50 and drain terminal electrode 52 of each p-channel HFET device (as shown in FIGS. 4B and 4C), the base terminal electrodes 58A, 58B of each p-type quantum-well-base bipolar transistor device (as shown in FIGS. 5B and 5C), and the collector terminal electrodes 68A, 68B of each n-type quantum-well-base bipolar transistor device (as shown in FIG. 6B). Metal layer 181 (which preferably comprises an n-type Au alloy metal such as AuGe/Ni/Au) is deposited on the mesas at the N+ layer 153 to formed the cathode terminal electrodes 40A, 40B of each heterojunction thyristor device (as shown in FIG. 2B), the gate terminal electrodes 54A, 54B of each p-channel HFET device (as shown in FIGS. 4B and 4C), and the emitter terminal electrodes 60A, 60B of each p-type quantum-well-base bipolar transistor device (as shown in FIGS. 5B and 5C).

For high performance quantum-well-base bipolar transistor devices, it is preferable that the vertical distance between QW base and the emitter/collector of the device be minimized. Such reduced vertical dimensions reduces the transit time delay of charge passing therethrough, and thus provides for higher frequency operation. Advantageously, the vertical dimension between the n-type ohmic contact layer 153 and the first quantum well in structure 20 in addition to the vertical dimension between the last quantum well in structure 24 and the top electrode metal layer 174 can be made small (e.g., on the order of 370–655 Å) to provide for high frequency operation.

For a high performance p-type quantum-well-base bipolar transistor device realized from the multilayer structures described herein, it is preferable that the effective area of the base-collector junction in addition to the effective area of the base-emitter junction be minimized. This reduces the base-collector capacitance and the base-emitter capacitance, and thus provides for higher frequency operation. Moreover, it is preferable that the resistance of the base terminal, the resistance of the collector terminal and the resistance of the emitter terminal be minimized to provide for higher frequency operation. In the p-type quantum-well-base bipolar transistor devices described herein, the effective area of the base-collector junction is controlled by the dimensions of the collector electrode metal layer 174. The resistance of the collector is minimized by controlling the doping concentration of the collector contact (N+ implant 49).

Figure 8A:
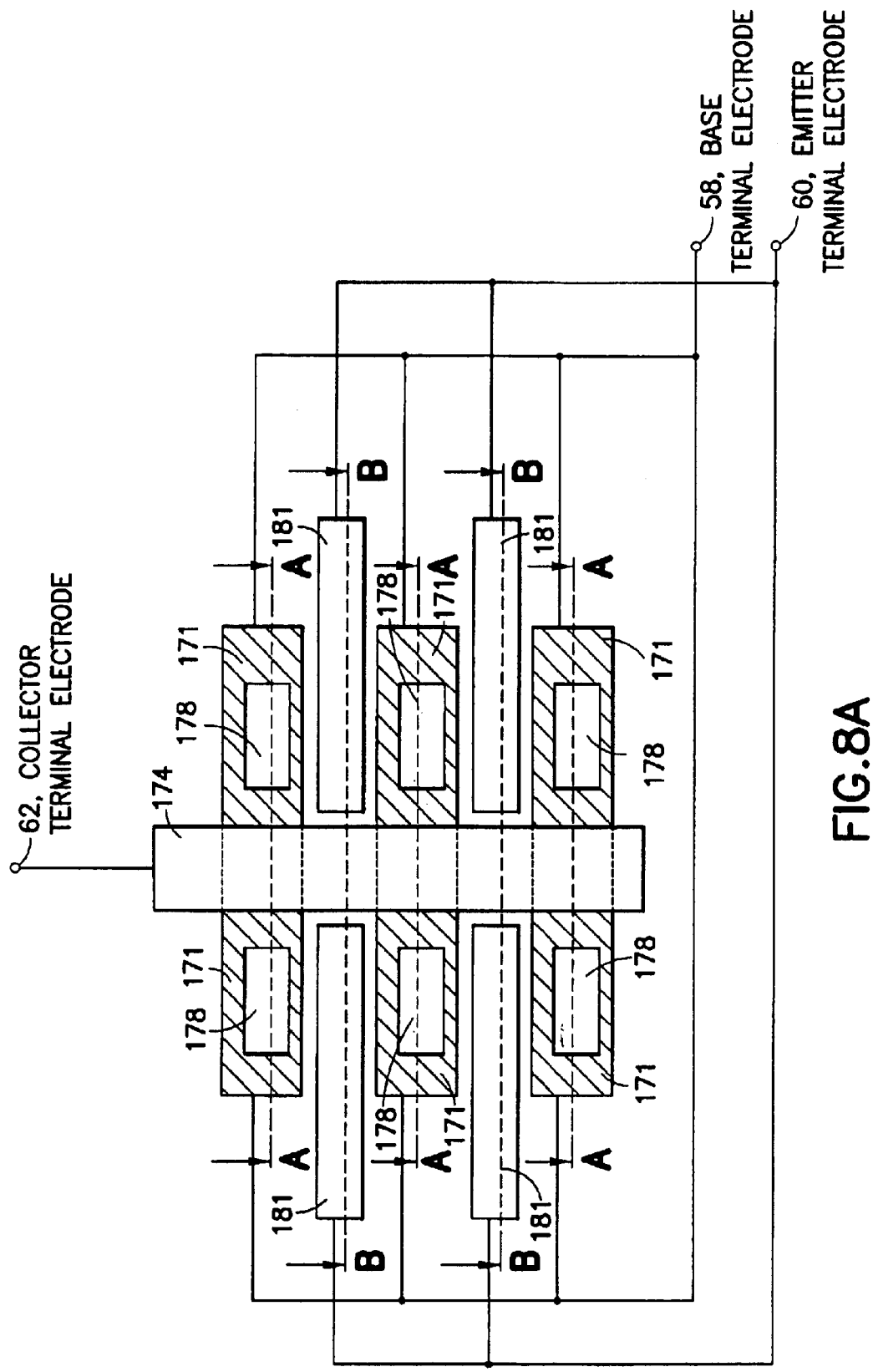

Turning now to FIGS. 8A through 8C2, the effective area of the base-emitter junction in addition to the base terminal resistance and emitter terminal resistance are minimized by interdigitization of the P+-type implants 171 on both sides of the collector metal layer 174. Such interdigitization is preferably accomplished as part of the operations of blocks B10 and B12 as described above with respect to FIG. 7. As shown in FIG. 8A, the P+ implants 171 are formed in selected areas on both sides of the collector metal layer 174. Importantly, these implants 171 are deep to a point near the dielectric layer 151 as shown in FIGS. 8B1 and 8C1, which reduces the effective area of the base-emitter junction, and eliminates much of the capacitance between the base and the emitter (e.g., the capacitance is reduced to that which exists along the sidewalls of the implants 171). Between the selected areas of the P+ implants 171, the structure is etched down through the p-type quantum well structure 20 to expose the n+ ohmic contact layer 153 for metallization/contact thereto as shown in FIGS. 8A, 8B2 and 8C2. Advantageously, the finger regions of metal layers 178/181 that are part of the base terminal electrode 58 and emitter terminal electrode 60 as shown in FIG. 8A provide very low base terminal resistance and emitter terminal resistance, respectively. In addition, because the implants are 171 are self-aligned to the metal layer 174, the width of the metal layer 174 may be minimized (preferably, to sub-micron widths). All of these features contribute to higher frequency operation of the device.

FIGS. 8B1 and 8B2 illustrate an exemplary p-type quantum-well-base transistor that is realized by interdigitization of the P+-type implants 171 on both sides of the collector metal layer 174 as shown in FIG. 8A. FIG. 8B1 illustrates the cross-section A—A of the device as shown in FIG. 8A, and FIG. 8B2 illustrates the cross-section B—B of the device as shown in FIG. 8A. Both cross-sections are similar to that described above with respect to the p-type quantum-well-base transistor device of FIG. 5C. Note that in FIG. 8C1, the P+ implants 171 are deep to a point near the dielectric layer 151, which reduces the effective area of the base-emitter junction, and eliminates much of the capacitance between the base and the emitter (e.g., the capacitance is reduced to that which exists along the sidewalls of the implants 171).

FIGS. 8C1 and 8C2 illustrate another exemplary p-type quantum-well-base transistor that is realized by interdigitization of the P+-type implants 171 on both sides of the collector metal layer 174 as shown in FIG. 8A. FIG. 8C1 illustrates the cross-section A—A of the device as shown in FIG. 8A, and FIG. 8C2 illustrates the cross-section B—B of the device as shown in FIG. 8A. Both cross-sections are similar to that described above with respect to the device of FIG. 5C; however, layer 164 is not etched away prior to the collector n-type implant 49. Thus, the collector terminal electrode 62 is subsequently formed thereon as shown. Note that in FIG. 8C1, the P+ implants 171 are deep to a point near the dielectric layer 151, which reduces the effective area of the base-emitter junction, and eliminates much of the capacitance between the base and the emitter (e.g., the capacitance is reduced to that which exists along the sidewalls of the implants 171).

There are many advantages gained by the semiconductor device structure described herein including: the FET capacitance and position of the gate voltage control are de-coupled from the doping used to achieve low gate contact resistance, the incidence of gate to source short circuits is greatly reduced, the effective (electrical) thickness of the gate dielectric can be made exceedingly thin, the layers can be accurately etched away to achieve low contact resistance, the threshold can be more easily adjusted by implant to obtain depletion devices, and manufacturability is much improved. Moreover, a broad array of optoelectronic devices can be integrated to form a monolithic optoelectronic integrated circuit suitable for many diverse applications. Such devices include optoelectronic thyristor. The thyristor has unique properties of sensitive detection in its OFF state and laser emission in its ON state. The thyristor structure may be used as a digital modulator, a transceiver, an amplifier and a directional coupler. These devices may be realized as either waveguide or vertical cavity devices. The vertical cavity construction enables resonant cavity operation of all device modes. In addition to the multiple optoelectronic devices, a wide array of transistor devices (including complementary HFET devices and complementary quantum-well-base bipolar transistors) are implementable.

There have been described and illustrated herein several embodiments of a semiconductor device employing at least one modulation doped quantum well structure and one or more etch stop layers for accurate contact formation and a method of fabricating such semiconductor devices to implement thyristors, transistors, optical emitters, optical detectors, optical modulators, optical amplifiers and other opto-electronic devices. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. Additionally, while particular formation and metallization techniques have been described, it will be appreciated that the described structures can be formed in other manners, and other metals used to form terminals. Further, while particular arrangements of bipolar and FET transistors, optical emitters, detectors, modulators, amplifiers, etc. formed from the described semiconductor structure, and circuits utilizing those components have been described, it will be appreciated that other devices and circuits can be made from the provided structure and components. It will therefore be appreciated by those skilled in the art that yet other modifications could be made to the provided invention without deviating therefrom.

What is claimed is:

1. A semiconductor device comprising:
a series of layers formed on a substrate, said layers including a first plurality of layers comprising n-type dopant material, a second plurality of layers forming a p-type modulation doped quantum well structure, and a third plurality of layers including at least one layer comprising n-type dopant material, wherein said first plurality of layers includes an n-type ohmic contact layer and a first etch stop layer disposed above said n-type contact layer, wherein portions of said first etch stop layer are removed for contacting said n-type ohmic contact layer.

2. A semiconductor device according to claim 1, wherein:
said first etch stop layer is sufficiently thin to permit current tunneling.

3. A semiconductor device according to claim 1, wherein:
said third plurality of layers forms an n-type modulation doped quantum well structure.

4. A semiconductor device according to claim 3, wherein:
said series of layers further comprises a fourth plurality of layers comprising p-type dopant material, said fourth plurality of layers including a p-type ohmic contact layer.

5. A semiconductor device according to claim 4, wherein:
said fourth plurality of layers includes a second etch stop layer disposed above said n-type modulation doped quantum well structure, wherein portions of said second etch stop layer are removed for contacting said n-type modulation doped quantum well structure.

6. A semiconductor device according to claim 5, wherein:
said second etch stop layer is sufficiently thin to permit current tunneling.

7. A semiconductor device according to claim 4, further comprising:
a first plurality of undoped spacer layers disposed between said first plurality of layers and said second plurality of layers;
a second plurality of undoped spacer layers disposed between said second plurality of layers and said third plurality of layers; and
a third plurality of undoped spacer layers disposed between said third plurality of layers and said fourth plurality of layers;
wherein said first plurality of undoped spacer layers and said third plurality of undoped spacer layers each include a thin capping layer.

8. A semiconductor device according to claim 1, further comprising:
a plurality of distributed bragg reflector (DBR) mirror layers formed on said substrate.

9. A semiconductor device according to claim 8, wherein:
said plurality of distributed bragg reflector (DBR) mirror layers comprise layers of AlAs and GaAs.

10. A semiconductor device according to claim 1, wherein:
said second plurality of layers comprise at least one layer of undoped InGaAsN and at least one layer of undoped GaAs that form at least one quantum well.

11. A semiconductor device according to claim 10, wherein:
said second plurality of layers comprise at least one layer of AlGaAs of high p-type doping concentration to form a modulation doped layer for said at least one quantum well.

12. A semiconductor device according to claim 3, wherein:
said third plurality of layers comprise at least one layer of undoped InGaAsN and at least one layer of undoped GaAs that form at least one quantum well.

13. A semiconductor device according to claim 12, wherein:
said third plurality of layers comprise at least one layer of AlGaAs of high n-type doping concentration to form a modulation doped layer for said at least one quantum well.

14. A semiconductor device according to claim 1, wherein:
said first etch stop layer comprises AlAs that functions as an etch stop during etching by a chlorine-based gas mixture that includes fluorine.

15. A semiconductor device according to claim 5, wherein:
said second etch stop layer comprises AlAs that functions as an etch stop during etching by a chlorine-based gas mixture that includes fluorine.

16. A semiconductor device according to claim 7, wherein:
said thin capping layer comprises GaAs.

17. A semiconductor device according to claim 4, further comprising:
an anode terminal electrode operably coupled to said p-type ohmic contact layer of said fourth plurality of layers, at least one injector terminal electrode operably coupled to one of said n-type modulation doped quantum well structure and said p-type modulation doped quantum well structure, and a cathode terminal operably coupled to said n-type ohmic contact layer to thereby implement a heterojunction thyristor device.

18. A semiconductor device according to claim 17, further comprising:
first ion implant regions comprising n-type ions that electrically couple said at least injector terminal electrode to said n-type modulation doped quantum well structure.

19. A semiconductor device according to claim 17, further comprising:
second ion implant regions comprising p-type ions that electrically couple said at least injector terminal electrode to said p-type modulation doped quantum well structure.

20. A semiconductor device according to claim 17, further comprising:
third ion implant regions comprising n-type ions that are disposed above said n-type modulation doped quantum well structure and that steer current into said n-type modulation doped quantum well structure.

21. A semiconductor device according to claim 17, wherein: said series of layers is formed in a resonant cavity realized by a first plurality of distributed bragg reflector (DBR) mirror layers formed on said substrate and a second plurality of distributed bragg reflector (DBR) mirror layers formed on said series of layers.

22. A semiconductor device according to claim 21, wherein:

said heterojunction thyristor device operates in an OFF state and an ON state, wherein current does not flow between said anode terminal electrode and said cathode terminal electrode in said OFF state, and wherein current flows between said anode terminal electrode and said cathode terminal electrode in said ON state.

23. A semiconductor device according to claim 22, wherein:
said heterojunction thyristor device switches from said OFF state to said ON state in response to optical energy supplied by an input optical signal and resonantly absorbed in at least one of said n-type quantum well structure and said p-type quantum well structure.

24. A semiconductor device according to claim 23, wherein:
said heterojunction thyristor device switches from said OFF state to said ON state in the event that said optical energy resonantly absorbed in at least one of said n-type quantum well structure and said p-type quantum well structure causes charge in said at least one of said n-type quantum well structure and said p-type quantum well structure to exceed a critical switching charge.

25. A semiconductor device according to claim 22, wherein:
said heterojunction thyristor device switches from said OFF state to said ON state in response to electrical energy that is injected via said at least one injector terminal into at least one of said n-type quantum well structure and said p-type quantum well structure.

26. A semiconductor device according to claim 25, wherein:
said heterojunction thyristor device switches from said OFF state to said ON state in the event that said electrical energy injected into at least one of said n-type quantum well structure and said p-type quantum well structure causes charge in said at least one of said n-type quantum well structure and said p-type quantum well structure to exceed a critical switching charge.

27. A semiconductor device according to claim 22, wherein:
said heterojunction thyristor device switches from said OFF state to said ON state in response to bias current that draws charge via said at least one injector terminal from at least one of said n-type quantum well structure and said p-type quantum well structure.

28. A semiconductor device according to claim 27, wherein:
said heterojunction thyristor device switches from said OFF state to said ON state in the event that said bias current reduces charge in at least one of said n-type quantum well structure and said p-type quantum well structure below a holding charge.

29. A semiconductor device according to claim 22, wherein:
said heterojunction thyristor device is adapted to operate as a laser to produce an output optical signal in said ON state.

30. A semiconductor device according to claim 22, wherein:
said heterojunction thyristor device is adapted to operate as an optical detector to produce an output electrical signal in said ON state.

31. A semiconductor device according to claim 22, wherein:
said heterojunction thyristor device is adapted to operate as an optically-controlled sampling switch having an input and an output, wherein said input is electrically coupled to said output in said ON state, and wherein said input is electrically isolated from said output in said OFF state.

32. A semiconductor device according to claim 22, wherein:
said heterojunction thyristor device is adapted to operate as an electrically-controlled sampling switch having an input and an output, wherein said input is electrically coupled to said output in said ON state, and wherein said input is electrically isolated from said output in said OFF state.

33. A semiconductor device according to claim 22, wherein:
said heterojunction thyristor device is adapted to operate as a digital optical modulator.

34. A semiconductor device according to claim 1, wherein:
said series of layers comprises group III–V materials.

35. A semiconductor device according to claim 1, wherein:
said series of layers comprises strained silicon heterostructures employing silicon-germanium (SiGe) layers.

* * * * *